(12) United States Patent
Joeng et al.

(10) Patent No.: US 12,258,460 B2
(45) Date of Patent: Mar. 25, 2025

(54) POLISHING PAD AND METHOD OF FABRICATING SEMICONDUCTOR DEVICE USING THE SAME

(71) Applicant: SK enpulse Co., Ltd., Gyeonggi-do (KR)

(72) Inventors: Eun Sun Joeng, Gyeonggi-do (KR); Jong Wook Yun, Seoul (KR); Jang Won Seo, Seoul (KR); Yong Ju Jeong, Gyeonggi-do (KR); Seung Kyun Kim, Gyeonggi-do (KR)

(73) Assignee: SK ENPULSE CO., LTD., Gyeonggi-Do (KR)

( * ) Notice: Subject to any disclaimer, the term of this patent is extended or adjusted under 35 U.S.C. 154(b) by 527 days.

(21) Appl. No.: 17/467,671

(22) Filed: Sep. 7, 2021

(65) Prior Publication Data

US 2022/0073694 A1 Mar. 10, 2022

(30) Foreign Application Priority Data

Sep. 7, 2020 (KR) .................. 10-2020-0113708
Oct. 6, 2020 (KR) .................. 10-2020-0128532
Oct. 6, 2020 (KR) .................. 10-2020-0128586

(51) Int. Cl.
| | |
|---|---|
| *C08J 9/232* | (2006.01) |
| *B24B 37/24* | (2012.01) |
| *C08G 18/16* | (2006.01) |
| *C08G 18/22* | (2006.01) |
| *C08G 18/32* | (2006.01) |
| *C08G 18/48* | (2006.01) |
| *C08G 18/66* | (2006.01) |
| *C08G 18/76* | (2006.01) |
| *C09K 3/14* | (2006.01) |
| *H01L 21/3105* | (2006.01) |

(52) U.S. Cl.
CPC .............. *C08J 9/232* (2013.01); *B24B 37/24* (2013.01); *C08G 18/161* (2013.01); *C08G 18/168* (2013.01); *C08G 18/225* (2013.01); *C08G 18/3206* (2013.01); *C08G 18/4854* (2013.01); *C08G 18/6674* (2013.01); *C08G 18/7621* (2013.01); *C08G 18/7671* (2013.01); *C09K 3/14* (2013.01); *H01L 21/31053* (2013.01); *C08G 2110/0025* (2021.01); *C08J 2203/22* (2013.01); *C08J 2375/08* (2013.01)

(58) Field of Classification Search
CPC ........ C09G 18/10; C09G 18/08; C09G 18/12; C09G 18/161; C09G 18/168; B24B 37/24
See application file for complete search history.

(56) References Cited

U.S. PATENT DOCUMENTS

| | | | |
|---|---|---|---|
| 7,488,236 B2 * | 2/2009 | Shimomura ............. | B24D 3/30 451/41 |
| 2005/0171225 A1 * | 8/2005 | Kulp .................. | C08G 18/4854 521/155 |
| 2014/0033615 A1 | 2/2014 | Itoyama et al. | |
| 2016/0059378 A1 * | 3/2016 | Kimura ....................... | C08J 9/30 51/296 |
| 2018/0071888 A1 | 3/2018 | Weis et al. | |

FOREIGN PATENT DOCUMENTS

| | | | |
|---|---|---|---|
| CN | 1586002 A | 2/2005 | |
| CN | 107813219 A | 3/2018 | |
| EP | 2806453 A1 | 11/2014 | |
| JP | 2012-111869 A | 6/2012 | |
| JP | 2016-196058 | * 11/2016 | ............. B24B 37/24 |
| KR | 10-2005-0033540 A | 4/2005 | |
| KR | 10-2008-0031525 A | 4/2008 | |
| KR | 10-2015-0081350 A | 7/2015 | |
| KR | 10-2018-0029912 A | 3/2018 | |
| KR | 10-1924566 B1 | 12/2018 | |
| KR | 10-2020-0079840 A | 7/2020 | |
| TW | 202031708 A | 9/2020 | |

OTHER PUBLICATIONS

Office Action for Korean Patent Application No. 10-2020-0128586 issued by the Korean Intellectual Property Office on Aug. 11, 2022.
Search Report for the Singapore Application No. 10202109716S issued by the Intellectual Property Office of Singapore on Aug. 8, 2022.

(Continued)

*Primary Examiner* — Pegah Parvini
(74) *Attorney, Agent, or Firm* — IP & T GROUP LLP

(57) ABSTRACT

Provided is a polishing pad including a polishing layer, wherein the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 is 0.10 to 0.45. The polishing pad includes the polishing layer having physical properties corresponding to the softening control index, and thus may exhibit a removal rate and defect prevention performance within desired ranges in polishing of a polishing target.

10 Claims, 2 Drawing Sheets

(56) References Cited

OTHER PUBLICATIONS

Written Opinion for the Singapore Application No. 10202109716S issued by the Intellectual Property Office of Singapore on Aug. 9, 2022.
Office Action issued by the Taiwanese Patent Office on Mar. 28, 2022.
Office Action issued by the Korean Intellectual Property Office on Jan. 12, 2021.
Office Action issued by the Korean Intellectual Property Office on Dec. 27, 2021.
Extended European Search Report issued by the European Patent Office on Feb. 10, 2022.

* cited by examiner

[FIG. 2]
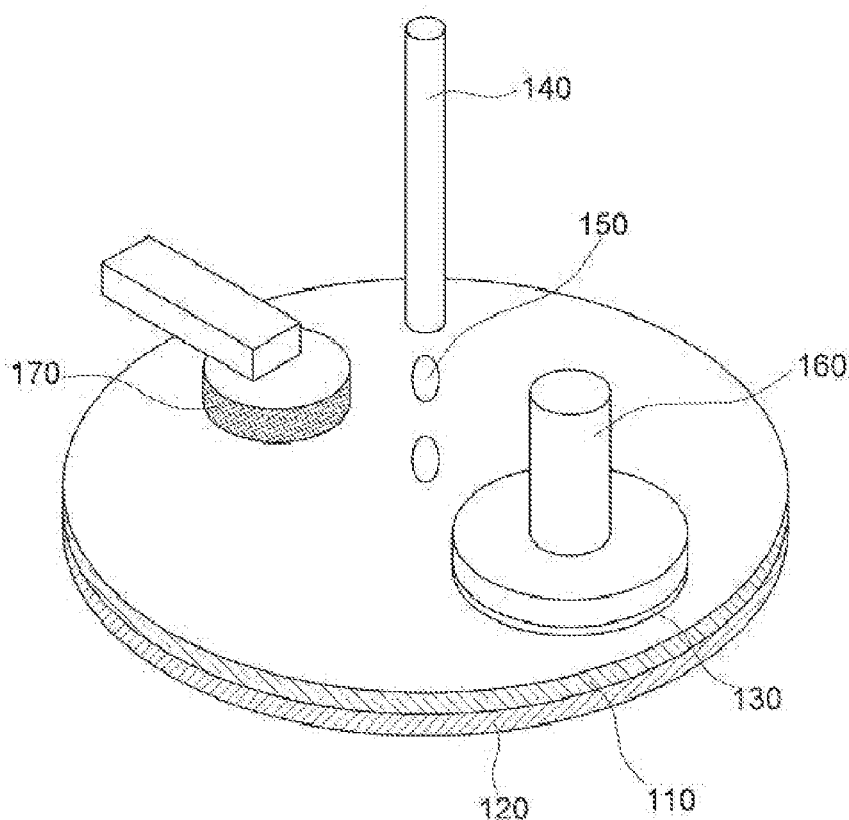
[FIG. 3]
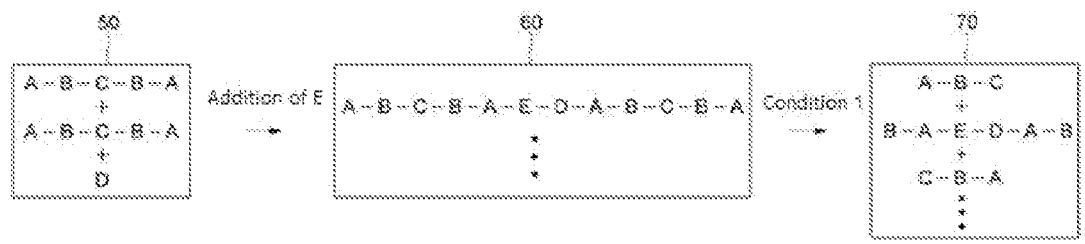

POLISHING PAD AND METHOD OF FABRICATING SEMICONDUCTOR DEVICE USING THE SAME

CROSS-REFERENCE TO RELATED APPLICATION(S)

This application claims priority to Korean Patent Application No. 10-2020-0113708, filed on Sep. 7, 2020, No. 10-2020-0128532, filed on Oct. 6, 2020, No. 10-2020-0128586, filed on Oct. 6, 2020, the disclosure of which is incorporated herein by reference in its entirety.

TECHNICAL FIELD

The present disclosure relates to a pad which is applied to a polishing process, and to a technique for applying this pad to a method for fabricating a semiconductor device.

DESCRIPTION OF THE RELATED ART

A chemical mechanical planarization (CMP) or chemical mechanical polishing (CMP) process may be performed for various purposes in various technical fields. The CMP process is performed on a predetermined polishing target surface of a polishing target, and may be performed for the purposes of planarization of the polishing target surface, removal of aggregated materials, reduction of crystal lattice damage, and removal of scratches and contamination sources.

CMP process technologies for semiconductor fabrication processes may be classified according to the quality of a polishing target layer or the surface shape after polishing. For example, they may be classified into a CMP process for single silicon and a CMP process for polysilicon according to the quality of a polishing target layer, and may also be classified into CMP processes for various oxide layers, which are distinguished by the types of impurities, or CMP processes for metal layers such as tungsten (W), copper (Cu), aluminum (Al), ruthenium (Ru) and tantalum (Ta) layers. In addition, according to the surface shape after polishing, they may be classified into a process of reducing the roughness of the substrate surface, a process of planarizing a stepped portion caused by multilayer circuit wiring, and a device isolation process for selectively forming circuit wiring after polishing.

A plurality of CMP processes may be applied in a process for fabricating a semiconductor device. A semiconductor device includes a plurality of layers, and each layer includes a complex and fine circuit pattern. In addition, in recent semiconductor devices, the size of an individual chip has been reduced, and the pattern of each layer has become more complex and finer. Accordingly, the CMP process in the process of fabricating a semiconductor device has been expanded not only for the purpose of planarizing circuit wiring, but also for isolation between circuit wirings and the improvement of the wiring surface, and as a result, more sophisticated and reliable CMP performance has been required.

A polishing pad which is used in this CMP process is a component for processing a polishing target surface to a required level through friction, and may be considered one of elements which are most important in the thickness uniformity of a polishing target after polishing, and the flatness and quality of the polishing target surface.

SUMMARY

One embodiment of the present disclosure provides a polishing pad, the polishing surface state of which may be maintained at the same level as the initial state even with the passage of time during a polishing process, so that the long-term polishing performance thereof does not deteriorate, and which has suitable physical properties such as hardness, tensile strength and elongation, and thus may achieve a desired level of removal rate and a defect prevention effect when applied to a polishing process.

Another embodiment of the present disclosure provides a method for fabricating a semiconductor device, which shows high process efficiency in polishing of a semiconductor substrate, and achieves an effect in that the polishing target surface of the semiconductor substrate shows an appropriate removal rate and the lowest level of defects as final polishing results.

In one embodiment of the present disclosure, there is provided a polishing pad including a polishing layer, wherein the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 below is about 0.10 to about 0.45:

$$\text{Softening control index} = \frac{I4}{100 + I2 + I3} \quad [\text{Equation 1}]$$

wherein

I2 is the ratio of the area of the second peak to the area of the first peak which is taken as 100.00, I3 is the ratio of the area of the third peak to the area of the first peak which is taken as 100.00, and I4 is the ratio of the area of the fourth peak to the area of the first peak which is taken as 100.00.

In one embodiment of the present disclosure, there is provided a polishing pad wherein the percentage of the area of the fourth peak relative to the total area of the first peak and the second peak is 30% to 75%, and the percentage of the total area of the first peak and the second peak relative to the total area of the first peak, the second peak and the third peak is 60% to 70%.

In one embodiment of the present disclosure, there is provided a polishing pad wherein the area ratio of the third peak to the second peak is 1:1 to 5:1, the area ratio of the first peak to the second peak is 10:1 to 10:5, and the area ratio of the first peak to the third peak is 10:5 to 10:10.

In one embodiment of the present disclosure, there is provided a polishing pad wherein the polishing layer has a value of 1 to 2 as calculated according to Equation 2 below:

$$\frac{Mw - Mn}{Mp - Mn} \quad [\text{Equation 2}]$$

wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours, Mw is the weight-average molecular weight of the depolymerized composition.

Mn is the number-average molecular weight of the depolymerized composition, and

Mp is the peak molecular weight of the depolymerized composition.

In one embodiment of the present disclosure, there is provided a polishing pad wherein the polishing layer includes a cured product of a preliminary composition containing a urethane-based prepolymer, the nuclear magnetic resonance (NMR) $^{13}$C spectrum of the preliminary composition shows a fifth peak and a sixth peak in descending order of peak position (ppm) at 16 ppm to 20 ppm, and the area ratio of the fifth peak to the sixth peak is 1:1 to 5:1.

In one embodiment of the present disclosure, there is provided a polishing pad wherein the nuclear magnetic resonance (NMR) $^{13}$C spectrum of the preliminary composition shows a fourth peak and a fifth peak in descending order of peak position (ppm) at 16 ppm to 20 ppm, and the area ratio of the fourth peak to the fifth peak is 1:1 to 5:1.

In one embodiment of the present disclosure, there is provided a polishing pad wherein the preliminary composition contains a reaction product of an isocyanate compound and a polyol compound, the isocyanate group content of the preliminary composition is 5 wt % to 11 wt %, the isocyanate compound includes an aromatic diisocyanate compound, and the polyol compound includes a low-molecular-weight polyol having a weight-average molecular weight (Mw) of about 100 g/mol to less than about 300 g/mol and a high-molecular-weight polyol having a weight-average molecular weight (Mw) of about 300 g/mol to about 1,800 g/mol.

In one embodiment of the present disclosure, there is provided a polishing pad wherein the aromatic isocyanate compound includes 2,4-toluene diisocyanate (2,4-TDI), and the preliminary composition contains a urethane-based prepolymer including at least one of a first unit structure derived from 2,4-TDI subjected to urethane reaction at one end, a second unit structure derived from 2,6-TDI subjected to urethane reaction at one end, and a third unit structure derived from 2,4-TDI subjected to urethane reaction at both ends, and further includes 2,6-TDI remaining unreacted at both ends.

In one embodiment of the present disclosure, there is provided a polishing pad wherein the polishing layer has a tensile strength of 20 to 25 N/mm$^2$ and an elongation of 90 to 130%.

In another embodiment of the present disclosure, there is provided a method for producing a polishing pad, the method including steps of: i) preparing a preliminary composition containing a reaction product of an isocyanate compound and a polyol compound; ii) preparing a composition for producing a polishing layer containing the preliminary composition, a foaming agent and a curing agent; and iii) producing a polishing layer by curing the composition for producing a polishing layer, wherein the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 below is 0.10 to 0.45:

$$\text{Softening control index} = \frac{I4}{100 + I2 + I3} \quad \text{[Equation 1]}$$

wherein

I2 is the ratio of the area of the second peak to the area of the first peak which is taken as 100.00.

I3 is the ratio of the area of the third peak to the area of the first peak which is taken as 100.00, and I4 is the ratio of the area of the fourth peak to the area of the first peak which is taken as 100.00.

In one embodiment of the present disclosure, there is provided a method for producing a polishing pad, wherein the area ratio of the third peak to the second peak is 1:1 to 5:1.

In one embodiment of the present disclosure, there is provided a method for producing a polishing pad, wherein the polishing layer has a value of 1 to 2 as calculated according to Equation 2 below:

$$\frac{Mw - Mn}{Mp - Mn} \quad \text{[Equation 2]}$$

wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours, Mw is the weight-average molecular weight of the depolymerized composition, Mn is the number-average molecular weight of the depolymerized composition, and Mp is the peak molecular weight of the depolymerized composition.

In one embodiment of the present disclosure, there is provided a method for producing a polishing pad, wherein the prepolymer composition is a urethane-based prepolymer, the urethane-based prepolymer has an isocyanate (NCO) group content of 5 to 10 wt %, and the molar ratio of the NH$_2$ group of the curing agent to the isocyanate (NCO) group of the urethane-based prepolymer in the composition for producing an polishing layer in step ii) is 0.8 to 1.

In another embodiment of the present disclosure, there is provided a method for fabricating a semiconductor device, the method including steps of: providing a polishing pad including a polishing layer; and placing the polishing target surface of a polishing target so as to be in contact with the polishing surface of the polishing layer and then polishing the polishing target while allowing the polishing target and the polishing pad to rotate relative to each other, wherein the polishing target includes a semiconductor substrate, the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 below is 0.10 to 0.45:

$$\text{Softening control index} = \frac{I4}{100 + I2 + I3} \quad \text{[Equation 1]}$$

wherein

I2 is the ratio of the area of the second peak to the area of the first peak which is taken as 100.00, I3 is the ratio of the area of the third peak to the area of the first peak which is taken as 100.00, and I4 is the ratio of the area of the fourth peak to the area of the first peak which is taken as 100.00.

In one embodiment of the present disclosure, there is provided a method for fabricating a semiconductor device, wherein the polishing layer has a value of 1 to 2 as calculated according to Equation 2 below:

$$\frac{Mw - Mn}{Mp - Mn} \qquad \text{[Equation 2]}$$

wherein wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours, Mw is the weight-average molecular weight of the depolymerized composition, Mn is the number-average molecular weight of the depolymerized composition, and Mp is the peak molecular weight of the depolymerized composition.

In one embodiment of the present disclosure, there is provided a method for fabricating a semiconductor device, wherein the area ratio of the third peak to the second peak is 1:1 to 5:1.

In one embodiment of the present disclosure, there is provided a method for fabricating a semiconductor device, wherein the semiconductor substrate includes a silicon dioxide ($SiO_2$) layer, the polishing target surface is the surface of the silicon dioxide ($SiO_2$) layer, the average removal rate of the silicon dioxide layer is 2,500 Å/min to 4,000 Å/min, and the number of surface defects on the polishing target surface after completion of the polishing is 5 or less.

In one embodiment of the present disclosure, there is provided a method for fabricating a semiconductor device, wherein the rotating speed of each of the polishing target and the polishing pad is 10 rpm to 500 rpm.

In one embodiment of the present disclosure, there is provided a method for fabricating a semiconductor device, further including a step of supplying a polishing slurry onto the polishing surface of the polishing layer, wherein the polishing slurry is supplied at a flow rate of 10 ml/min to 1,000 ml/min.

BRIEF DESCRIPTION OF THE DRAWINGS

FIG. 2 schematically illustrates a process drawing of a method for fabricating a semiconductor device according to an embodiment.

FIG. 3 is a schematic diagram illustrating an exemplary preliminary composition, a cured structure, and a processed composition.

DESCRIPTION OF SPECIFIC EMBODIMENTS

Figure 1A:
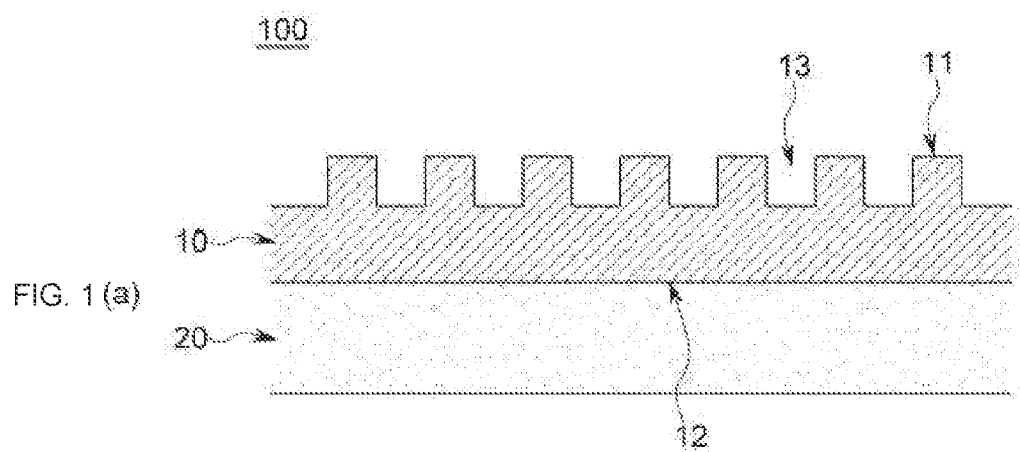
FIGS. 1(a) and 1(b) schematically illustrate a section of a polishing pad according to an embodiment.

The advantages and features of the present disclosure, and the way of attaining them, will become apparent with reference to the embodiments described below. However, the present disclosure is not limited to the embodiments disclosed below and may be embodied in a variety of different forms. Rather, these embodiments are provided so that this disclosure will be thorough and complete, and will fully convey the scope of the present disclosure to those skilled in the art. The scope of the present disclosure should be defined only by the appended claims.

In the drawings, the thicknesses of various layers and regions are exaggerated for clarity. In addition, in the drawings, the thicknesses of some layers and regions are exaggerated for convenience of illustration. Throughout the specification, like reference numerals refer to like components.

In addition, in the present specification, when a part, such as a layer, film, region, plate, or the like, is referred to as being "on" or "above" another part, it not only refers to a case where the part is directly above the other part, but also a case where a third part exists therebetween. Conversely, when any part is referred to as being "directly above" another part, it refers to a case where a third part does not exist therebetween. In addition, when a part, such as a layer, film, region, plate, or the like, is referred to as being "below" or "under" another part, it not only refers to a case where the part is directly below the other part, but also a case where a third part exists therebetween. Conversely, when any part is referred to as being "directly below" another part, it refers to a case where a third part does not exist therebetween.

In addition, in the present specification, the area ratio of peaks in the nuclear magnetic resonance (NMR) spectrum is interpreted as falling within the scope of the claims if the number average value determined by calculating the area ratio at least five times in the same manner for the same polishing layer is within the corresponding range. In addition, the area ratio of the peaks may be obtained as integration values of the corresponding peaks in the nuclear magnetic resonance (NMR) spectrum.

In one embodiment of the present disclosure, there is provided a polishing pad including a polishing layer, wherein the nuclear magnetic resonance (NMR) $^{13}C$ spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 below is about 0.10 to about 0.45:

$$\text{Softening control index} = \frac{I4}{100 + I2 + I3} \qquad \text{[Equation 1]}$$

wherein

I2 is the ratio of the area of the second peak to the area of the first peak which is taken as 100.00, I3 is the ratio of the area of the third peak to the area of the first peak which is taken as 100.00, and I4 is the ratio of the area of the fourth peak to the area of the first peak which is taken as 100.00.

In one embodiment of the present disclosure, there is provided a polishing pad including a polishing layer, wherein the nuclear magnetic resonance (NMR) $^{13}C$ spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, and a third peak appearing at 138 ppm to 143 ppm, and the area ratio of the third peak to the second peak is about 1:1 to about 5:1.

The polishing pad is a process product that may be applied to various polishing processes, and the defect rate and production quality of process products produced using the polishing pad are greatly affected by the physical properties of the polishing pad. For various polishing processes, it is necessary to finely control the surface properties of the polishing layer in order to apply the polishing layer not only to a bulk-level polishing process, but also to micro- and nano-level fine polishing processes, and even if there is no significant difference in absolute value for each physical property, this insignificant difference may lead to a great difference in the polishing properties.

The polishing layer is a cured product composed of compounds having certain chemical structures, and the final polishing performance thereof, such as removal rate and the degree of defects may be determined according to the chemical structure of each of the compounds and the bonding structure and bonding force of each repeating unit constituting the chemical structure. The compounds included in the polishing layer include various types of chemical bonding structures, and when the polishing layer is treated under certain treatment conditions, the bonding may be broken or maintained depending on the bonding strength of each bonding structure. Accordingly, the shape of the nuclear magnetic resonance (NMR) $^{13}$C spectrum of the processed composition of the polishing layer is changed.

Specifically, the polishing layer according to one embodiment may be characterized in that the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 above is 0.10 to 0.45. In addition, the polishing layer may be characterized in that the area ratio of the third peak to the second peak is about 1:1 to about 5:1.

The "softening control index" is an index indicating the degree of ductility imparted to the polishing layer by the compounds constituting the polishing layer due to the chemical structures thereof, etc. If the softening control index is excessively low or excessively high, the polishing layer will not exhibit appropriate hardness and elongation, and hence in a polishing process to which the polishing pad is applied, the polishing layer may have inappropriate physical and/or chemical effects on the polishing target, resulting in deterioration in final polishing performance.

In Equation 1 above, I2 and I3 are respectively the area ratios of the second peak and the third peak to the area of the first peak which is taken as 100.00. Here, the first peak, the second peak and the third peak are peaks derived from chemical structures capable of increasing the hardness of the polishing layer, among chemical structures present in the processed composition, and function as factors indicating the influence of hard segments in Equation 1 above. Meanwhile, I4 in Equation 1 above is the ratio of the area of the fourth peak to the area of the first peak which is taken as 100.00. Here, the fourth peak is a peak derived from a chemical structure capable of relatively reducing the hardness of the polishing layer, among chemical structures present in the processed composition, and functions as a factor indicating the influence of soft segments in Equation 1 above.

The polishing layer according to one embodiment may have a softening control index of about 0.10 to about 0.45, for example, about 0.10 to about 0.40, for example, about 0.20 to about 0.40, for example, about 0.25 to about 0.40, as calculated according to Equation 1 above. If the softening control index is excessively low, the polishing layer will have an excessively high hardness or an excessively low elongation, and thus may cause defects such as scratches on the surface of the polishing target during polishing. In addition, if the softening control index is excessively high, a problem may arise in that the polishing layer has an excessively low hardness or an excessively high elongation, and thus the removal rate does not reach a desired level. That is, as the softening control index satisfies the above-described range, the polishing layer may exhibit appropriate hardness and elongation, and thus may exhibit appropriate elasticity and surface properties to the polishing target during the polishing process, thereby exhibiting advantageous effects in terms of removal rate, polishing flatness, prevention of occurrence of defects, and the like.

The softening control index is derived from the nuclear magnetic resonance (NMR) $^{13}$C spectrum of a processed composition prepared by treating the polishing layer under predetermined conditions. Specifically, the softening control index is derived from a processed composition prepared by adding 1 g of the polishing layer to a 0.3M aqueous solution of potassium hydroxide (KOH) and allowing the mixture to react in a closed container at a temperature of 150° C. for 48 hours. It was confirmed that the nuclear magnetic resonance (NMR) $^{13}$C spectrum of the processed composition prepared by treating the polishing layer under such conditions showed a higher correlation with the final polishing performance of the polishing pad than those of processed compositions prepared by treating the polishing layer under other conditions.

In the conditions for treating the polishing layer, the pressure in the closed container may be 3 bar or less. However, the pressure is not limited to a specific condition, as long as it is the pressure in the closed container.

In the nuclear magnetic resonance (NMR) $^{13}$C spectrum of the processed composition, the percentage of the area of the fourth peak relative to the total area of the first peak and the second peak may be about 30% to about 75%, for example, about 30% to about 70%, for example, about 35% to about 65%. When the ratio of the area of the fourth peak, which functions as a factor indicating the influence of soft segments, to the total area of the first peak and the second peak among the first, second and third peaks which function as factors indicating the influence of hard segments, satisfies the above-described range, there is an advantage in that the polishing layer may exhibit appropriate tensile strength and hardness, thereby exhibiting a desired level of polishing performance.

In the nuclear magnetic resonance (NMR) $^{13}$C spectrum of the processed composition, the percentage of the total area of the first peak and the second peak relative to the total area of the first peak, the second peak and the third peak may be about 60% to about 70%. As the influence of the first peak and the second peak among all factors indicating the influence of hard segments takes up a proportion corresponding to the percentage value, the polishing layer may have an appropriate chemical bonding structure, and thus may effectively ensure physical properties suitable for achieving desired polishing performance in terms of hardness, tensile strength, elongation and the like.

In one embodiment, the area ratio of the third peak to the second peak may be about 1:1 to about 5:1, for example, about 1:1 to 4.5:1, for example, about 1.5:1 to about 4.5:1. Through the result that the area ratio of the third peak to the second peak satisfies the above range, it can be seen that the polishing layer has chemically bonded repeating units that are partially decomposed under certain conditions and exhibit the above-described peaks, and, at the same time, it can be seen that the polishing layer includes compounds having chemical structures corresponding to the area ratio on the whole. Accordingly, the polishing layer may have appropriate hardness and elongation, and as a result, may achieve a desired removal rate and defect reduction effect.

The polishing layer has a degree of polymer bonding satisfying the above-described area ratio of the third peak to the second peak in the nuclear magnetic resonance (NMR) $^{13}$C spectrum of the processed composition that satisfies the above-described condition, and it may exhibit physical properties (such as hardness and elongation) corresponding thereto, and as a result, may achieve polishing performance such as a desired level of removal rate (RR).

For example, the area ratio of the third peak to the second peak may be about 1:1 to about 5:1, for example, about 1:1 to about 4.5:1, for example, about 1.5:1 to about 4.5:1. Through the result that the area ratio of the third peak to the second peak satisfies the above range, it can be seen that the polishing layer has chemically bonded repeating units that are partially decomposed under certain conditions and exhibit the above-described peaks, and, at the same time, it can be seen that the polishing layer includes compounds having chemical structures corresponding to the area ratio on the whole. Accordingly, the polishing layer may have appropriate hardness and elongation, and as a result, may achieve a desired removal rate and defect reduction effect.

In one embodiment, the area ratio of the first peak to the second peak in the nuclear magnetic resonance (NMR) $^{13}$C spectrum of the processed composition may be about 10:1 to about 10:5, and the area ratio of the first peak to the third peak may be about 10:5 to about 10:10.

For example, the area ratio of the first peak to the second peak may be about 10:1 to about 10:5, for example, about 10:1.50 to about 10:5, for example, about 10:1.60 to about 10:5, for example, more than about 10:1.60 to less than or equal to about 10:1.80.

For example, the area ratio of the first peak to the third peak may be from about 10:5 to about 10:10, for example, more than about 10:5.00 to less than or equal to about 10:10.00.

It can be seen that, when the area ratio of the third peak to the second peak in the nuclear magnetic resonance (NMR) $^{13}$C spectrum of the processed composition satisfies the above-described range while the area ratio of the first peak to the second peak and the area ratio of the first peak to the third peak satisfy the above-described ranges, the polishing layer has been cured to an appropriate degree of curing in a curing process during production. Accordingly, the polishing layer may exhibit appropriate hardness and elongation, and as a result, may achieve a desired removal rate and defect reduction effect.

In addition, the nuclear magnetic resonance (NMR) $^{13}$C spectrum of the processed composition prepared by adding 1 g of the polishing layer to a 0.3 M aqueous solution of potassium hydroxide (KOH) and allowing the mixture to react in a closed container at a temperature of 150° C. for 48 hours showed a higher correlation with the polishing performance of the final polishing pad than that of a processed composition prepared by treatment under other conditions.

The shape of the nuclear magnetic resonance (NMR) $^{13}$C spectrum of the processed composition may be determined by comprehensively controlling factors, including the types and contents of raw material monomers, process temperature and pressure conditions, and the types and contents of additives such as a curing agent and a foaming agent, which are used in the process of producing the polishing layer.

The polishing layer may have a value of 1 to 2 as calculated according to Equation 2 below:

$$\frac{Mw - Mn}{Mp - Mn} \qquad \text{[Equation 2]}$$

wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours. More specifically, the molecular weights are measured by adding 1 g of the polishing layer to 15 ml of a 0.3 M aqueous solution of KOH, placing the aqueous KOH solution containing the polishing layer in a closed container having a volume of 45 to 50 ml, depolymerizing the polishing layer at 150° C. and 3 bar for 48 hours, extracting the depolymerized composition with methylene chloride, and then measuring the molecular weight of the extracted composition by a GPC system.

Mw is the weight-average molecular weight of the depolymerized composition, Mn is the number-average molecular weight of the depolymerized composition, and Mp is the peak molecular weight of the depolymerized composition.

The polishing layer includes a cured product obtained by curing a composition containing a urethane-based prepolymer, a curing agent, and a foaming agent, and the urethane-based prepolymer may be produced by reacting a polyol with an isocyanate.

Depending on the type and content of a curing agent that may be included in the production of the polishing layer, the equivalents of curing reactive groups such as an amine group (—NH$_2$) and an alcohol group (—OH) in the curing agent and an isocyanate group (—NCO) in the prepolymer are determined, and the structures of the compounds in the polishing layer are determined.

The final urethane-based cured structure of the polishing pad is determined by these factors. The final urethane-based cured structure may lead to the physical/mechanical properties of the polishing layer, such as hardness, tensile strength, and elongation. The physical/mechanical properties of the polishing layer may affect the average removal rate (Å/min) and the pad cutting rate (µm/hr) in the CMP polishing process.

The polishing pad is a process product that may be applied to various polishing processes, and the defect rate and production quality of process products produced using the polishing pad are greatly affected by the physical properties of the polishing pad. For various polishing processes, it is necessary to finely control the surface properties of the polishing layer in order to apply the polishing layer not only to a bulk-level polishing process, but also to micro- and nano-level fine polishing processes, and even if there is no significant difference in absolute value for each physical property, this insignificant difference may lead to a great difference in the polishing properties.

The polishing layer is a cured product composed of compounds having certain chemical structures, and the final polishing performance thereof, such as removal rate and the degree of defects may be determined according to the chemical structure of each of the compounds and the bonding structure and bonding force of each repeating unit constituting the chemical structure. The compounds included in the polishing layer include various types of chemical bonding structures, and when the polishing layer is treated under certain treatment conditions, the bonding may be broken or maintained depending on the bonding force of each bonding structure. Based on this property, the polishing layer of the present disclosure is depolymerized, and the weight-average molecular weight (Mw), number-average molecular weight (Mn) and peak molecular weight (Mp) of the depolymerized composition are measured and substituted into Equation 2 above. When the measured values are included within the ranges specified in the present disclosure, the compounds constituting the polishing layer may exhibit physical properties resulting from their chemical structures, and may exhibit excellent polishing performance by exhibiting appropriate tensile strength and elongation due to the physical properties.

Equation 2 above means that, when the polishing layer is depolymerized under specific depolymerization conditions, the structures of the compounds constituting the polishing layer are decomposed under the depolymerization conditions, and the physical and/or chemical properties of the polishing layer may be confirmed by measuring values for the decomposed compounds.

That is, if the value of Equation 2 above, which is a physical and/or chemical index given to the polishing layer by the compounds constituting the polishing layer due to their chemical structures or the like, is excessively low or high, the polishing layer will not exhibit an appropriate hardness and elongation, and hence, in a polishing process to which the polishing pad is applied, the polishing layer may have an inappropriate physical and/or chemical effect on a polishing target, and thus the final polishing performance thereof may deteriorate.

The value calculated by Equation 2 above may be 1 to 2, preferably 0.6 to 0.95. If the value calculated by Equation 2 is excessively low, the hardness of the polishing layer may be excessively high or the elongation thereof may be excessively low, and thus the probability of occurrence of defects such as scratches on the surface of a polishing target layer during polishing may increase. In addition, if the value calculated by Equation 2 is excessively high, a problem may arise that the removal rate does not reach a desired level. That is, when the value calculated by Equation 2 is within the above range, the polishing layer may exhibit appropriate hardness and elongation, and based on these properties, the polishing layer may exhibit appropriate elasticity and physical properties for a polishing target layer during a polishing process, and thus may exhibit advantageous effects in terms of removal rate, pad cutting rate, defect prevention, and the like.

In addition, the polishing layer may have a tensile strength of 20 to 25 N/mm² and an elongation of 90 to 130%. Where the value calculated by Equation 2 above satisfies the range specified in the present disclosure, the tensile strength and elongation values are included within the above ranges. Thus, when the polishing layer is applied to a polishing process, it may exhibit high removal rate, excellent pad cut rate, and excellent defect prevention properties.

The pad cut rate may be calculated from the pad wear amount, and the pad wear amount may be analyzed by the pad cut rate (PCR). Specifically, the "pad wear amount" or "pad cut rate" may be measured from the initial pad height and the pad height measured after polishing and conditioning the wafer between CMP processes for a certain period of time. As the pad wear amount increases, the pad cut rate increases, and as the pad wear amount decreases, the pad cut rate decreases.

If the pad cut rate is excessively low, a phenomenon may occur in which the lifespan of the pad is reduced may occur. This phenomenon may cause a decrease in production yield and process yield because defects on a semiconductor substrate in the CMP process tend to increase. Therefore, it may be an important task to increase the pad cut rate under conditions that can increase the average removal rate.

Accordingly, the polishing layer of the present disclosure satisfies the range calculated by Equation 2 as described above, has excellent physical properties, and thus may exhibit high average removal rate and excellent pad cut rate.

Specifically, the weight-average molecular weight (Mw) of the depolymerized composition may be 2,600 to 4,000, preferably 2,600 to 3,500. In addition, the number average molecular weight (Mn) of the depolymerized composition may be 2,500 to 3,000, preferably 2,500 to 2,800.

In a conventional art, in order to apply a polishing pad to a CMP process, it was necessary to check the average removal rate and the pad cut rate through a direct polishing test on the polishing pad, and to examine whether the polishing pad could be applied.

This implies that it is necessary to check performance through a polishing test when selecting a polishing pad to be used in the polishing process, suggesting that a time- and cost-consuming procedure is essential.

On the contrary, according to the present disclosure, the average removal rate and pad cut rate values for the polishing pad may be predicted using the GPC measurement result values after depolymerization of the polishing layer and the value calculated by Equation 2 above.

This suggests that it is possible to predict the performance of the polishing pad even without performing a direct polishing test, thereby greatly simplifying the procedure for applying the polishing pad to the polishing process.

Figure 1B:
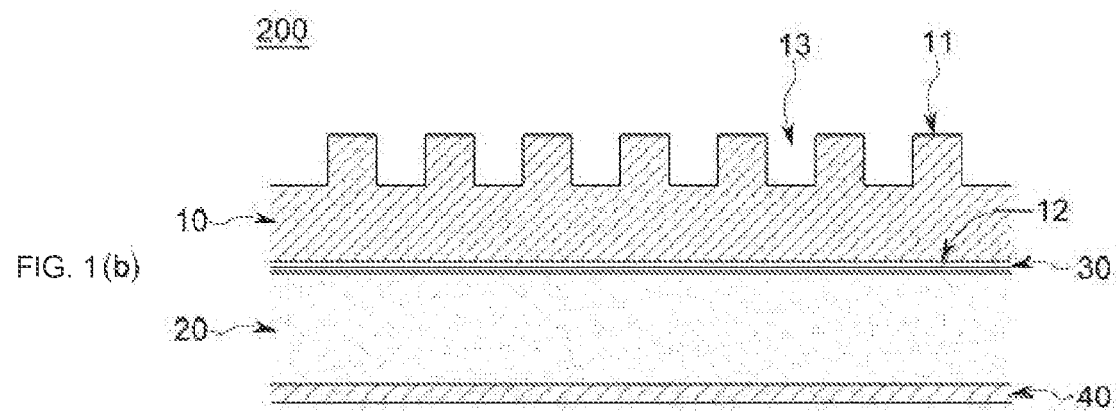

FIGS. 1(a) and 1(b) schematically illustrates a section of a polishing pad 100 according to an embodiment.

Referring to FIG. 1(a), the polishing pad 100 includes a polishing layer 10, and may include a cushion layer 20 on one surface of the polishing layer 10. The polishing layer 10 is in the form of a sheet having a predetermined thickness, and may include a first surface 11 functioning as a polishing surface coming into direct or indirect contact with the polishing target surface of a polishing target, and may include a second surface 12 opposite to the first surface 11.

In one embodiment, the first surface 11 may include grooves 13 machined to a depth less than the thickness of the polishing layer 10. The first surface 11 may include a plurality of grooves 13. In one embodiment, the planar structure of the polishing pad 100 may be substantially circular, and the plurality of grooves 13 may include concentric grooves arranged from the center of the polishing layer 10 toward the end thereof with respect to the planar structure of the first surface 11 so as to be spaced apart from each other at a predetermined distance. In another embodiment, the plurality of grooves 13 may include radial grooves continuously extending from the center of the polishing layer 10 toward the end thereof with respect to the planar structure of the first surface 11. In still another embodiment, the plurality of grooves 13 may include both the concentric grooves and the radial grooves. The grooves 13 may serve to control the fluidity of a polishing solution or polishing slurry that is supplied onto the first surface 11 during a polishing process that is performed using the polishing pad 100, or to control physical polishing properties by controlling the contact area between the first surface 11 and the polishing target surface of a polishing target.

In one embodiment, the thickness of the polishing layer 10 may be about 0.8 mm to about 5.0 mm, for example, about 1.0 mm to about 4.0 mm, for example, about 1.0 mm to 3.0 mm, for example, about 1.5 mm to about 3.0 mm, for example, about 1.7 mm to about 2.7 mm, for example, about 2.0 mm to about 3.5 mm.

The polishing layer 10 may have a porous structure including a plurality of pores. The average diameter of the plurality of pores may be, but is not limited to, about 5 μm to about 50 μm, for example, about 5 μm to about 40 μm, for example, about 10 μm to about 40 μm, for example, about 10 μm to about 35 μm. The plurality of pores may appear as fine concave portions (not shown), a part of which is exposed to the outside from the polishing surface of the polishing layer and distinguished from the grooves 13. The plurality of pores together with the grooves may function as a control element for polishing properties by determining the fluidity and mooring space of the polishing liquid or polishing slurry during use of the polishing pad.

The polishing surface 11 may have a predetermined surface roughness due to the fine concave portions that are distinguished from the grooves 13. In one embodiment, the surface roughness (Ra) of the polishing surface 11 may be about 3 μm to about 1 mm. For example, the surface roughness (Ra) of the polishing surface 11 may be about 3 μm to about 20 μm, for example, about 3 μm to about 10 μm.

The cushion layer 20 is disposed on the second surface 12 of the polishing layer 10 and may serve to relieve the external pressure or impact transmitted to the polishing target surface during the polishing process while supporting the polishing layer 10. Thereby, the cushion layer 20 may contribute to preventing damage to the polishing target and defects thereon from occurring in the polishing process to which the polishing pad 100 is applied.

In one embodiment, the cushion layer 20 may have a thickness of about 0.5 mm to about 2.5 mm, for example, about 0.8 mm to about 2.5 mm, for example, about 1.0 mm to about 2.5 mm, about 1.0 mm to about 2.0 mm, for example, about 1.2 mm to about 1.8 mm.

Referring to FIG. 1 (b), in one embodiment, the polishing pad 200 includes the polishing layer 10 and the cushion layer 20, and may further include a first adhesive layer 30 disposed at the interface between the polishing layer 10 and the cushion layer 20. For example, the first adhesive layer 30 may be derived from a heat-sealing adhesive, but is not limited thereto.

The polishing pad 200 may further include a second adhesive layer 40 disposed on the second surface 12 of the polishing layer 10. The second adhesive layer 40 is a configuration for attaching the polishing pad to the surface plate of a polishing apparatus, and may be disposed directly on the second surface 12 of the polishing layer 10, or may be disposed on another layer such as the cushion layer 20 on the polishing layer 10, as shown in FIG. 1(b). For example, the second adhesive layer 40 may be derived from a pressure sensitive adhesive, but is not limited thereto.

In one embodiment, the polishing pad may include a penetrating region penetrating the uppermost layer and the lowermost layer thereof. The penetrating region is a configuration for detecting a polishing endpoint during use of the polishing pad, and light having a predetermined wavelength may pass therethrough. In one embodiment, a light-transmitting window may be disposed in the penetrating region. The light-transmitting window may have a transmittance of more than about 30%, for example, about 40% to about 80%, for light having any one wavelength selected from wavelengths of about 500 nm to about 700 nm.

The polishing layer may include a cured product of a preliminary composition containing a urethane-based prepolymer. In one embodiment, the preliminary composition may further contain a curing agent and a foaming agent. The term "prepolymer" refers to a polymer with a relatively low molecular weight, the polymerization of which has been stopped in an intermediate step in the production of a cured product so as to facilitate molding. The prepolymer itself may be subjected to an additional curing process such as heating and/or pressurization, or the prepolymer may be mixed and reacted with another polymerizable compound, for example, an additional compound such as a different kind of monomer or a different kind of prepolymer, and then formed into a final cured product.

In one embodiment, the urethane-based prepolymer may be produced by reacting an isocyanate compound with a polyol compound.

The isocyanate compound that is used in the production of the urethane-based prepolymer may be one selected from the group consisting of an aromatic isocyanate, an aliphatic isocyanate, an alicyclic isocyanate, and combinations thereof. For example, the isocyanate compound may include an aromatic diisocyanate. For example, the isocyanate compound may include an aromatic diisocyanate and an alicyclic diisocyanate.

The isocyanate compound may include, for example, one selected from the group consisting of 2,4-toluenediisocyanate (2,4-TDI), 2,6-toluenediisocyanate (2,6-TDI) naphthalene-1,5-diisocyanate, p-phenylenediisocyanate, tolidinediisocyanate, 4,4'-diphenylmethanediisocyanate, hexamethylenediisocyanate, dicyclohexylmethanediisocyanate, 4,4'-dicyclohexylmethanediisocyanate ($H_{12}$MDI), isoporone diisocyanate, and combinations thereof.

The term "polyol" refers to a compound containing at least two hydroxyl groups (—OH) per molecule. In one embodiment, the polyol compound may include a dihydric alcohol compound having two hydroxyl groups, that is, a diol or a glycol, or a trihydric alcohol compound having three hydroxyl groups, that is a triol compound.

The polyol compound may include, for example, one selected from the group consisting of polyether polyol, polyester polyol, polycarbonate polyol, acrylic polyol, and combinations thereof.

The polyol compound may include, for example, one selected from the group consisting of polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, and combinations thereof.

The polyol compound may have a weight-average molecular weight (Mw) of about 100 g/mol to about 3,000 g/mol. For example, the polyol compound may have a weight-average molecular weight (Mw) of from about 100 g/mol to about 3,000 g/mol, for example, about 100 g/mol to about 2,000 g/mol, for example, about 100 g/mol to about 1,800 g/mol.

In one embodiment, the polyol compound may include a low-molecular-weight polyol having a weight average molecular weight (Mw) of about 100 g/mol to less than about 300 g/mol, and a high-molecular-weight polyol having a weight-average molecular weight (Mw) of about 300 g/mol to about 1,800 g/mol. The weight-average molecular weight (Mw) of the high-molecular-weight polyol may be, for example, about 500 g/mol to about 1,800 g/mol, for example, about 700 g/mol to about 1,800 g/mol. In this case, the polyol compound may form an appropriate cross-linked structure in the urethane-based prepolymer, and the polishing layer formed by curing of the preliminary composition containing the urethane-based prepolymer under certain process conditions may more effectively exhibit the above-described effect. That is, the nuclear magnetic resonance (NMR) $^{13}C$ spectrum of the processed composition prepared by treating the polishing layer under predetermined conditions may exhibit the above-described peak characteristics by the appropriate cross-linked structure of the polyol compound, and the polishing layer may exhibit excellent polishing properties based on the softening control index corresponding to the peak characteristics.

The urethane-based prepolymer may have a weight-average molecular weight (Mw) of about 500 g/mol to about 3,000 g/mol. The urethane-based prepolymer may have a weight-average molecular weight (Mw) of, for example, about 600 g/mol to about 2,000 g/mol, for example, about 800 g/mol to about 1,000 g/mol. When the urethane-based prepolymer has a degree of polymerization corresponding to the above-described weight-average molecular weight (Mw), the polishing layer formed by curing the preliminary composition under predetermined process conditions may more advantageously have a chemical bonding structure for achieving the above-described excellent polishing properties.

In one embodiment, the isocyanate compound for producing the urethane-based prepolymer may include an aromatic diisocyanate compound. The aromatic diisocyanate compound may include, for example, 2,4-toluene diisocyanate (2,4-TDI), and may include, for example, 2,4-toluene diisocyanate (2,4-TDI) and 2,6-toluenediisocyanate (2,6-TDI). In addition, the polyol compound for producing the urethane-based prepolymer may include, for example, polytetramethylene ether glycol (PTMG) and diethylene glycol (DEG).

In another embodiment, the isocyanate compound for producing the urethane-based prepolymer may include an aromatic diisocyanate compound and an alicyclic diisocyanate compound. The aromatic diisocyanate compound may include, for example, 2,4-toluene diisocyanate (2,4-TDI), and may include, for example, 2,4-toluene diisocyanate (2,4-TDI) and 2,6-toluene diisocyanate (2,6-TDI). The alicyclic diisocyanate compound may include, for example, dicyclohexylmethanediisocyanate ($H_{12}$MDI). In addition, the polyol compound for producing the urethane-based prepolymer may include, for example, polytetramethylene ether glycol (PTMG) and diethylene glycol (DEG).

In the preliminary composition, the total amount of the polyol compound may be about 100 parts by weight to about 250 parts by weight, for example, about 120 parts by weight to about 250 parts by weight, for example, for example, about 120 parts by weight to about 240 parts by weight, for example, about 120 parts by weight to about 200 parts by weight, for example, about 120 parts by weight to about 170 parts by weight, based on 100 parts by weight of the total amount of the isocyanate compound among the total components for producing the urethane-based prepolymer.

In the preliminary composition, when the isocyanate compound for producing the urethane-based prepolymer includes the aromatic isocyanate compound and the aromatic isocyanate compound includes 2,4-TDI and 2,6-TDI, the content of 2,6-TDI may be about 1 part by weight to about 40 parts by weight, for example, about 1 part by weight to about 30 parts by weight, for example, about 3 parts by weight to about 28 parts by weight, for example, about 1 part by weight to about 10 parts by weight, for example, about 20 part by weight to about 30 parts by weight, based on 100 parts by weight of the 2,4-TDI.

In the preliminary composition, when the isocyanate compound for producing the urethane-based prepolymer includes the aromatic isocyanate compound and the alicyclic isocyanate compound, the content of the alicyclic isocyanate compound may be about 5 parts by weight to about 30 parts by weight, for example, about 10 parts by weight to about 25 parts by weight, based on 100 parts by weight of the total weight of the aromatic isocyanate compound.

The preliminary composition may have an isocyanate group content (NCO %) of about 5 wt % to about 11 wt %, for example, about 5 wt % to about 10 wt %, for example, about 5 wt % to about 8 wt %, for example, about 8 wt % to about 10 wt %, for example, about 8.5 wt % to about 10 wt %. The term "isocyanate group content" means the weight percentage of isocyanate groups (—NCO), which are present as free reactive groups without being subjected to urethane reaction, relative to the total weight of the preliminary composition. The isocyanate group content (NCO %) of the preliminary composition may be designed by comprehensively controlling the types and contents of the isocyanate compound and polyol compound for producing the urethane-based prepolymer, process conditions such as the temperature, pressure and time of the process for producing the urethane-based prepolymer, and the types and contents of additives that are used in the production of the urethane-based prepolymer.

In one embodiment, the nuclear magnetic resonance (NMR) $^{13}C$ spectrum of the preliminary composition may show a fifth peak and a sixth peak in descending order of peak position (ppm) at 16 ppm to 20 ppm, and the area ratio of the fifth peak to the sixth peak may be about 1:1 to about 5:1.

Specifically, the nuclear magnetic resonance (NMR) $^{13}C$ spectrum of the preliminary composition may have a fifth peak in a range of 17.5 ppm to 20.0 ppm and a sixth peak in a range of 16 ppm to 17.5 ppm. For example, the area ratio of the fifth peak to the sixth peak may be about 1:1 to about 5:1, for example, about 1:1 to 4:1, for example, about 1:1 to about 3.5:1, for example about 1:1 to less than 8:1. The polishing layer formed by curing the preliminary composition having such peak characteristics under predetermined process conditions may exhibit a desired level of removal rate and have an excellent defect reduction effect.

The preliminary composition is a composition containing the urethane-based prepolymer, and the chemical bonding structure in the cured structure of the polishing layer may vary depending on the chemical structure of the urethane-based prepolymer itself, and/or the concentrations of free functional groups contained in the urethane-based prepolymer and free reactive groups contained in the remaining unreacted monomers. Meanwhile, even if the types or contents of the monomers constituting the urethane-based prepolymer and the remaining unreacted monomers are the same, the chemical bond structure in the cured structure of the polishing layer and the resulting nuclear magnetic resonance (NMR) $^{13}C$ spectrum peak characteristics may vary depending on reaction process conditions for producing the urethane-based prepolymer, or curing process conditions for producing the polishing layer, or processing conditions for preparing the processed composition.

As a view for explaining this variation, FIG. 3 is a schematic view illustrating an example of each of a preliminary composition 50, a cured structure 60 constituting the polishing layer, and a processed composition 70. Referring to FIG. 3, the preliminary composition 50 is prepared by reacting monomer A, monomer B, monomer C, and monomer D, and may contain, for example, a first prepolymer (A-B-C-B-A) and a second prepolymer (A-B-C-B-D), and may include unreacted monomer D. When the types of monomers for preparing the preliminary composition 50 change, the chemical structure of the prepolymer will also change. In addition, even when the same monomers are used as raw materials, the structure of the prepolymer and the type of unreacted monomer may vary depending on reaction conditions such as temperature, pressure and time for preparing the preliminary composition 50. Subsequently, additive E is added to the preliminary composition 50, and then the cured structure 60 having a longer chain structure and cross-linked structure than the prepolymer is formed by curing under curing process conditions such as a predetermined temperature, pressure and time. The chemical structure of the cured structure 60 may also vary depending on the type of the additive and/or process conditions for producing the polishing layer. Then, the cured structure 60 is treated under condition 1 to obtain a processed composition 70. At least a portion of the bond structure of the cured structure 60 is broken and dissociated under condition 1, and thus a final processed composition 70 including structure 1 (A-B-C), structure 2 (B-A-E-D-A-B) and structure 3 (C-B-A) is obtained. In this case, processed compositions obtained by treatment under conditions other than condition 1 will include structures having chemical structures different from those of structures 1, 2 and 3 above.

That is, the peak characteristics of the nuclear magnetic resonance (NMR) $^{13}$C spectrum of a processed composition obtained by treatment under conditions, under which 1 g of the polishing layer is added to a 0.3 M aqueous solution of potassium hydroxide (KOH) and allowed to react in a closed container at a temperature of 150° C. for 48 hours, are characteristics comprehensively displayed by the organic relationship between the preliminary composition for producing the polishing layer, the types and contents of monomers for producing the urethane-based prepolymer of the preliminary composition, various process conditions in the processes for preparation of the preliminary composition and production of the polishing layer, and treatment conditions for obtaining the processed composition. However, the technical purpose of the polishing pad according to one embodiment is to reveal the correlation that the resultant polishing performance of the polishing pad is realized at a desired level when the softening control index resulting from the peak characteristics of the nuclear magnetic resonance (NMR) $^{13}$C spectrum of the processed composition satisfies the above-described conditions. As long as this purpose is satisfied, even the case in which slightly different types and contents of monomers, slightly different process conditions, etc. are applied cannot be regarded as departing from the scope of rights sought in the present disclosure.

In one embodiment, the isocyanate compound for producing the urethane-based prepolymer may include an aromatic diisocyanate compound, and the aromatic diisocyanate compound may include 2,4-toluene diisocyanate (2,4-TDI) and 2,6-toluenediisocyanate (2,6-TDI). In this case, the urethane-based prepolymer may include at least one of a first unit structure derived from 2,4-TDI subjected to urethane reaction at one end, a second unit structure derived from 2,6-TDI subjected to urethane reaction at one end, and a third unit structure derived from 2,4-TDI subjected to urethane reaction at both ends. As used herein, the expression "subjected to urethane reaction at one end" means that one of two isocyanate groups of a diisocyanate has been subjected to urethane reaction, and the expression "subjected to urethane reaction at both ends" means that two isocyanate groups of a diisocyanate have all been subjected to urethane reaction. In addition, the term "unit structure" refers to at least one structural unit included in the chemical structure of the main chain of the prepolymer.

In one embodiment, the urethane-based prepolymer may include a plurality of prepolymers having different repeating structures, and each of the prepolymers may independently include at least one of the first unit structure, the second unit structure and the third unit structure. Accordingly, the polishing layer including the cured product of the preliminary composition may more effectively exhibit a desired level of polishing performance.

The preliminary composition may further contain 2,6-TDI remaining unreacted at both ends. The expression "remaining unreacted at both ends" means that two isocyanate groups of the diisocyanate have not reacted. The 2,6-TDI remaining unreacted at both ends is a free monomer remaining in the preliminary composition. As the preliminary composition contains 2,6-TDI remaining unreacted at both ends, an appropriate crosslinked structure or chain extended structure may be formed during curing of the preliminary composition, and thus the softening control index resulting from the above-described peak characteristics of the processed composition may be effectively within the desired range.

As described above, the nuclear magnetic resonance (NMR) $^{13}$C spectrum peak characteristics of the preliminary composition may be comprehensively determined by the types and contents of monomers constituting the urethane-based prepolymer, the type and content of unreacted monomer remaining in addition to the urethane-based prepolymer, the chemical bond structure of the urethane-based prepolymer, reaction process conditions for producing the urethane-based prepolymer, and the like.

The curing agent is a compound that chemically reacts with the urethane-based prepolymer to form a final cured structure in the polishing layer, and may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline (MOCA), diethyltoluenediamine (DETDA), diaminodiphenylmethane, dimethyl thio-toluene diamine (DMTDA), propanediol bis-p-aminobenzoate, methylene bis-methylanthranilate, diaminodiphenylsulfone, m-xylylenediamine, isophoronediamine, ethylenediamine, diethylenetriamine, triethylenetetramine, polypropylenediamine, polypropylenetriamine, bis(4-amino-3-chlorophenyl)methane, and combinations thereof.

The content of the curing agent may be about 18 parts by weight to about 27 parts by weight, for example, about 19 parts by weight to about 26 parts by weight, for example, about 20 parts by weight to about 26 parts by weight, based on 100 parts by weight of the preliminary composition.

When the content of the curing agent satisfies the above range, the desired performance of the polishing pad be more effectively achieved.

When the curing agent includes an amine compound, the molar ratio of isocyanate (NCO) groups in the preliminary composition to amine ($NH_2$) groups in the curing agent may be about 1:0.85 to about 1:0.99, for example, about 1:0.89 to about 1:0.99, for example, about 1:0.90 to about 1:0.96

The foaming agent is a component for forming a pore structure in the polishing layer, and may include one selected from the group consisting of a solid foaming agent, a gaseous foaming agent, a liquid foaming agent, and combinations thereof. In one embodiment, the foaming agent may include a solid foaming agent, a gaseous foaming agent, or a combination thereof.

The average particle diameter of the solid foaming agent may be about 5 μm to about 200 μm, for example, about 20 μm to about 50 μm, for example, about 21 μm to about 50 μm, for example, about 21 μm to about 40 μm. When the solid foaming agent is thermally expanded particles as described below, the average particle diameter of the solid foaming agent means the average particle diameter of the thermally expanded particles themselves, and when the solid foaming agent is unexpanded particles as described below, the average particle diameter of the solid foaming agent may mean the average particle diameter of the solid foaming agent after being expanded by heat or pressure.

The solid foaming agent may include expandable particles. The expandable particles are particles having a property that can be expanded by heat or pressure, and the size thereof in the final polishing layer may be determined by the heat or pressure applied during the process of producing the polishing layer. The expandable particles may include thermally expanded particles, unexpanded particles, or a combination thereof. The thermally expanded particles are particles pre-expanded by heat, and refer to particles having little or no size change caused by the heat or pressure applied during the process of producing the polishing layer. The unexpanded particles are non-pre-expanded particles, and refer to particles whose final size is determined by expansion caused by the heat or pressure applied during the process of producing the polishing layer.

The expandable particle may include: an outer shell made of a resin material; and an expansion-inducing component enclosed by and present in the outer shell.

For example, the outer shell may include a thermoplastic resin, and the thermoplastic resin may be at least one selected form the group consisting of a vinylidene chloride-based copolymer, an acrylonitrile-based copolymer, a methacrylonitrile-based copolymer, and an acrylic copolymer.

The expansion-inducing component may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

The solid foaming agent may optionally include particles treated with an inorganic component. For example, the solid foaming agent may include expandable particles treated with an inorganic component. In one embodiment, the solid foaming agent may include expandable particles treated with silica ($SiO_2$) particles. The treatment of the solid foaming agent with the inorganic component may prevent aggregation between a plurality of particles. The chemical, electrical and/or physical properties of the surface of the inorganic component-treated solid foaming agent may differ from those of a solid foaming agent not treated with the inorganic component.

The content of the solid foaming agent may be about 0.5 parts by weight to about 10 parts by weight, for example, about 1 part by weight to about 3 parts by weight, for example, about 1.3 parts by weight to about 2.7 parts by weight, for example, about 1.3 parts by weight to about 2.6 parts by weight, based on 100 parts by weight of the urethane-based prepolymer.

The type and content of the solid foaming agent may be designed depending on the desired pore structure and physical properties of the polishing layer.

The gaseous foaming agent may include an inert gas. The gaseous foaming agent may be used as a pore-forming element which is added during a reaction between the urethane-based prepolymer and the curing agent.

The type of inert gas is not particularly limited as long as it does not participate in the reaction between the urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gaseous foaming agent may be designed depending on the desired pore structure and physical properties of the polishing layer.

In one embodiment, the foaming agent may include a solid foaming agent. For example, the foaming agent may consist only of a solid foaming agent.

The solid foaming agent may include expandable particles, and the expandable particles may include thermally expanded particles. For example, the solid foaming agent may consist only of thermally expanded particles. When the solid foaming agent consists only of the thermally expanded particles without including the unexpanded particles, the variability of the pore structure may be lowered, but the possibility of predicting the pore structure may increase, and thus the solid foaming agent may effectively achieve homogeneous pore properties throughout the polishing layer.

In one embodiment, the thermally expanded particles may be particles having an average particle diameter of about 5 μm to about 200 μm. The average particle diameter of the thermally expanded particles may be about 5 μm to about 100 μm, for example, about 10 μm to about 80 μm, for example, about 20 μm to about 70 μm, for example, about 20 μm to about 50 μm, for example, about 30 μm to about 70 μm, for example, about 25 μm to 45 μm, for example, about 40 μm to about 70 μm, for example, about 40 μm to about 60 μm. The average particle diameter is defined as the D50 of the thermally expanded particles.

In one embodiment, the density of the thermally expanded particles may be about 30 kg/$m^3$ to about 80 kg/$m^3$, for example, about 35 kg/$m^3$ to about 80 kg/$m^3$, for example, about 35 kg/$m^3$ to about 75 kg/$m^3$, for example about 38 kg/m³ to about 72 kg/m³, for example, about 40 kg/m³ to about 75 kg/m³, for example, 40 kg/m³ to about 72 kg/m³.

In one embodiment, the foaming agent may include a gaseous foaming agent. For example, the foaming agent may include a solid foaming agent and a gaseous foaming agent. Details regarding the solid foaming agent are as described above.

The gaseous foaming agent may include nitrogen gas.

The gaseous foaming agent may be injected through a predetermined injection line during the process in which the urethane-based prepolymer, the solid foaming agent and the curing agent are mixed together. The injection rate of the gaseous foaming agent may be about 0.8 L/min to about 2.0 L/min, for example, about 0.8 L/min to about 1.8 L/min, for example, about 0.8 L/min to about 1.7 L/min, for example, about 1.0 L/min to about 2.0 L/min, for example, about 1.0 L/min to about 1.8 L/min, for example, about 1.0 L/min to about 1.7 L/min.

The composition for producing a polishing layer may further contain other additives such as a surfactant and a reaction rate controller. The names such as "surfactant" and "reaction rate controller" are arbitrary names given based on the main function of the corresponding substance, and each corresponding substance does not necessarily perform only a function limited to the function indicated by the corresponding name.

The surfactant is not particularly limited as long as it is a material that serves to prevent aggregation or overlapping of pores. For example, the surfactant may include a silicone-based surfactant.

The surfactant may be used in an amount of about 0.2 parts by weight to about 2 parts by weight based on 100 parts by weight of the urethane-based prepolymer. Specifically, the surfactant may be contained in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to 1.5 parts by weight, based on 100 parts by weight of the urethane-based prepolymer. When the surfactant is contained in an amount within the above range, pores derived from the gaseous foaming agent may be stably formed and maintained in a mold.

The reaction rate controller serves to accelerate or retard the reaction, and depending on the purpose thereof, may include a reaction accelerator, a reaction retarder, or both. The reaction rate controller may include a reaction accelerator. For example, the reaction accelerator may be at least one reaction accelerator selected from the group consisting of a tertiary amine-based compound and an organometallic compound.

Specifically, the reaction rate controller may include at least one selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl)ether, trimethylaminoethylethanolamine, N,N,N,N,N"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanorbonene, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controller may include at least one selected from the group consisting of benzyldimethylamine, N,N-dimethylcyclohexylamine, and triethylamine.

The reaction rate controller may be used in an amount of about 0.05 parts by weight to about 2 parts by weight based on 100 parts by weight of the urethane-based prepolymer. Specifically, the reaction rate controller may be used in an amount of about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight. parts, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to about 1 part by weight, based on 100 parts by weight of the urethane-based prepolymer. When the reaction rate controlling agent is used in an amount within the above-described content range, it is possible to appropriately control the curing reaction rate of the preliminary composition to form a polishing layer having pores of a desired size and a desired hardness.

When the polishing pad includes a cushion layer, the cushion layer may serve to absorb and disperse an external impact applied to the polishing layer while supporting the polishing layer, thereby minimizing the occurrence of damage to the polishing target and defects thereon during the polishing process to which the polishing pad is applied.

The cushion layer may include, but is not limited to, non-woven fabric or suede.

In one embodiment, the cushion layer may be a resin-impregnated nonwoven fabric. The nonwoven fabric may be a fiber nonwoven fabric including one selected from the group consisting of polyester fibers, polyamide fibers, polypropylene fibers, polyethylene fibers, and combinations thereof.

The resin impregnated into the nonwoven fabric may include one selected from the group consisting of polyurethane resin, polybutadiene resin, styrene-butadiene copolymer resin, styrene-butadiene-styrene copolymer resin, acrylonitrile-butadiene copolymer resin, styrene-ethylene-butadiene-styrene copolymer resin, silicone rubber resin, polyester-based elastomer resin, polyamide-based elastomer resin, and combinations thereof.

In the polishing pad according to one embodiment, the hardness (Shore D) of the polishing surface of the polishing layer may be about 50 or more, for example, about 50 to about 75, for example, about 55 to 65. The tensile strength of the polishing layer may be 20 N/mm² or more, for example, about 20 N/mm² to 30 N/mm², for example, about 20 N/mm² to about 26 N/mm². The elongation of the polishing layer may be about 90% or more, for example, about 90% to about 130%. The cut rate of the polishing layer may be about 80 μm/hr or less, for example, about 40 μm/hr to about 80 μm/hr, for example, about 40 μm/hr to about 60 μm/hr. For example, when the hardness of the polishing surface, the tensile strength and elongation of the polishing layer, and the cut rate of the polishing layer are simultaneously within the above-described ranges, the polishing layer may be evaluated as exhibiting physical and mechanical properties corresponding to the peak characteristics of the processed composition. In this case, the polishing pad including the polishing layer may be applied to a semiconductor device process and may exhibit excellent polishing performance.

Hereinafter, a method for producing the polishing pad will be described.

In another embodiment of the present disclosure, there may be provided a method for producing a polishing pad, the method including steps of: preparing a preliminary composition containing a prepolymer; preparing a composition for producing a polishing layer containing the preliminary composition, a foaming agent and a curing agent; and producing a polishing layer by curing the composition for producing a polishing layer.

The step of preparing the preliminary composition may be a process of producing a urethane-based prepolymer by reacting a diisocyanate compound with a polyol compound. Details regarding the diisocyanate compound and the polyol compound are as described above with respect to the polishing pad.

The isocyanate group content (NCO %) of the preliminary composition may be about 5 wt % to about 11 wt %, for example, about 5 wt % to about 10 wt %, for example, 5 wt % to 8 wt %, for example, 8 wt % to 10 wt %, for example, about 8.5 wt % to about 10 wt %. In this case, the polishing layer having the above-described chemical bond structure may be more effectively obtained. The isocyanate group content of the preliminary composition may be derived from the terminal isocyanate groups of the urethane-based prepolymer, the unreacted isocyanate groups in the diisocyanate compound, and the like.

The viscosity of the preliminary composition may be about 100 cps to about 1,000 cps, for example, about 200 cps to about 800 cps, for example, about 200 cps to about 600 cps, for example, about 200 cps to about 550 cps, for example, about 300 cps to about 500 cps, at about 80° C.

The foaming agent may include a solid foaming agent or a gaseous foaming agent. Details regarding the type of foaming agent and the like are as described above with respect to the polishing pad.

When the foaming agent includes a solid foaming agent, the step of preparing the composition for producing a polishing layer may include steps of: preparing a first preliminary composition by mixing the preliminary composition and the solid foaming agent; and preparing a second preliminary composition by mixing the first preliminary composition and a curing agent.

The viscosity of the first preliminary composition may be about 1,000 cps to about 2,000 cps, for example, about 1,000 cps to about 1,800 cps, for example, about 1,000 cps to about 1,600 cps, for example, about 1,000 cps to about 1,500 cps, at about 80° C.

When the foaming agent includes a gaseous foaming agent, the step of preparing the composition for producing a polishing layer may include steps of: preparing a third preliminary composition containing the preliminary composition and the curing agent; and preparing a fourth preliminary composition by injecting the gaseous foaming agent into the third preliminary composition.

In one embodiment, the third preliminary composition may further contain a solid foaming agent.

In one embodiment, the process of producing a polishing layer may include steps of: preparing a mold preheated to a first temperature; and injecting and curing the composition for producing a polishing layer in the preheated mold; and post-curing the cured composition for producing a polishing layer at a second temperature higher than the preheating temperature.

In one embodiment, the temperature difference between the first temperature and the second temperature may be about 10° C. to about 40° C., for example, about 10° C. to about 35° C., for example, about 15° C. to about 35° C.

In one embodiment, the first temperature may be about 60° C. to about 100° C., for example, about 65° C. to about 95° C., for example, about 70° C. to about 90° C.

In one embodiment, the second temperature may be about 100° C. to about 130° C., for example, about 100° C. to 125° C., for example, about 100° C. to about 120° C.

The step of curing the composition for producing a polishing layer at the first temperature may be performed for about 5 minutes to about 60 minutes, for example, about 5 minutes to about 40 minutes, for example, about 5 minutes to about 30 minutes, for example, about 5 minutes to about 25 minutes.

The step of post-curing the composition (cured at the first temperature) for producing a polishing layer at the second temperature may be performed for about 5 hours to about 30 hours, for example, about 5 hours to about 25 hours, for example, about 10 hours to about 30 hours, for example, about 10 hours to about 25 hours, for example, about 12 hours to about 24 hours, for example, about 15 hours to about 24 hours.

The polishing layer finally produced through the process of producing a polishing layer may be characterized in that the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 above is about 0.10 to about 0.45.

For example, the softening control index calculated by Equation 1 may be about 0.10 to about 0.40, for example, about 0.20 to about 0.40, for example, about 0.25 to about 0.40.

In addition, the polishing layer finally produced through the process of producing a polishing layer may be characterized in that the nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, and a third peak appearing at 138 ppm to 143 ppm, and the area ratio of the third peak to the second peak is about 1:1 to about 5:1.

For example, the area ratio of the third peak to the second peak may be about 1:1 to about 5:1, for example, about 1:1 to about 4.5:1, for example, about 1.5:1 to about 4.5:1.

In one embodiment, the area ratio of the first peak to the second peak in the nuclear magnetic resonance (NMR) $^{13}$C spectrum of the processed composition may be about 10:1 to about 10:5, and the area ratio of the first peak to the third peak may be about 10:5 to about 10:10. For example, the area ratio of the first peak to the second peak may be about 10:1 to about 10:5, for example, about 10:1.50 to about 10:5, for example, about 10:1.60 to about 10:5, for example, more than about 10:1.60 to less than or equal to 10:1.80. For example, the area ratio of the first peak to the third peak may be about 10:5 to about 10:10, for example, more than about 10:5.00 and less than or equal to about 10:10.00.

The polishing layer may have a value of 1 to 2 as calculated according to Equation 2 below:

$$\frac{Mw - Mn}{Mp - Mn} \quad \text{[Equation 2]}$$

wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours. More specifically, the molecular weights are measured by adding 1 g of the polishing layer to 15 ml of a 0.3 M aqueous solution of KOH, placing the aqueous KOH solution containing the polishing layer in a closed container having a volume of 45 to 50 ml, depolymerizing the polishing layer at 150° C. and 3 bar for 48 hours, extracting the depolymerized composition with methylene chloride, and then measuring the molecular weight of the extracted composition by a GPC system.

Mw is the weight-average molecular weight of the depolymerized composition, Mn is the number-average molecular weight of the depolymerized composition, and Mp is the peak molecular weight of the depolymerized composition.

The method of producing a polishing pad may include a step of processing at least one surface of the polishing layer.

The step of processing at least one surface of the polishing layer may include at least one of steps of: (1) forming grooves on at least one surface of the polishing layer; (2) line-turning at least one surface of the polishing layer, and (3) roughening at least one surface of the polishing layer.

In step (1), the grooves may include at least one of concentric grooves arranged from the center of the polishing layer so as to be spaced apart from each other at a predetermined distance, and radial grooves continuously extending from the center of the polishing layer to the edge of the polishing layer.

In step (2), the line turning may be performed by a method of cutting the polishing layer by a predetermined thickness by means of a cutting tool.

The roughening in step (3) may be performed by a method of processing the surface of the polishing layer with sanding rollers.

The method of producing a polishing pad may further include a step of laminating a cushion layer on a surface opposite to the polishing surface of the polishing layer. Details regarding the cushion layer are as described above with respect to the polishing pad.

The polishing layer and the cushion layer may be laminated to each other through a heat-sealing adhesive.

The heat-sealing adhesive may be applied onto a surface opposite to the polishing surface of the polishing layer, and the heat-sealing adhesive may be applied onto the surface to be in contact with the polishing layer of the cushion layer. The polishing layer and the cushion layer may be laminated to each other in such a manner that the surfaces to which the heat-sealing adhesive has been applied come into contact with each other, and then the two layers may be laminated to each other using a pressure roller.

In another embodiment of the present disclosure, there is provided a method for fabricating a semiconductor device, the method including steps of: providing a polishing pad including a polishing layer; and placing the polishing target surface of a polishing target so as to be in contact with the polishing surface of the polishing layer and then polishing the polishing target while allowing the polishing target and the polishing pad to rotate relative to each other, wherein the polishing target includes a semiconductor substrate, the nuclear magnetic resonance (NMR) $^{13}C$ spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and the softening control index calculated by Equation 1 below is about 0.10 to about 0.45:

$$\text{Softening control index} = \frac{I4}{100 + I2 + I3} \quad \text{[Equation 1]}$$

wherein

I2 is the ratio of the area of the second peak to the area of the first peak which is taken as 100.00, I3 is the ratio of the area of the third peak to the area of the first peak which is taken as 100.00, and I4 is the ratio of the area of the fourth peak to the area of the first peak which is taken as 100.00.

In addition, there is provided a method for fabricating a semiconductor, wherein the nuclear magnetic resonance (NMR) $^{13}C$ spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, and a third peak appearing at 138 ppm to 143 ppm, and the area ratio of the third peak to the second peak is about 1:1 to about 5:1.

The polishing layer may have a value of 1 to 2 as calculated according to Equation 2 below:

$$\frac{Mw - Mn}{Mp - Mn} \quad \text{[Equation 2]}$$

wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours. More specifically, the molecular weights are measured by adding 1 g of the polishing layer to 15 ml of a 0.3 M aqueous solution of KOH, placing the aqueous KOH solution containing the polishing layer in a closed container having a volume of 45 to 50 ml, depolymerizing the polishing layer at 150° C. and 3 bar for 48 hours, extracting the depolymerized composition with methylene chloride, and then measuring the molecular weight of the extracted composition by a GPC system.

Mw is the weight-average molecular weight of the depolymerized composition, Mn is the number-average molecular weight of the depolymerized composition, and Mp is the peak molecular weight of the depolymerized composition.

Details regarding the polishing layer and the processed composition thereof are the same as those described above with respect to the polishing pad. When the polishing pad including the polishing layer having the above-described characteristics is applied in the method for fabricating a semiconductor device, the semiconductor device fabricated through this method may exhibit excellent functions derived from excellent polishing results of the semiconductor substrate.

FIG. 2 schematically illustrates a method for fabricating a semiconductor device according to an embodiment. Referring to FIG. 2, in the step of providing the polishing pad including the polishing layer, the polishing pad 110 may be disposed and provided on a surface plate 120.

The polishing target may include a semiconductor substrate, and the semiconductor substrate 130 may be disposed such that a polishing target surface thereof is in contact with the polishing surface of the polishing layer of the polishing pad 110. In this case, the polishing target surface of the semiconductor substrate 130 and the polishing surface of the polishing layer may come into direct contact with each other or come into indirect contact through a flowable slurry or the like.

In one embodiment, the method for fabricating a semiconductor device may further include a step pf supplying a polishing slurry 150 onto the polishing surface of the polishing layer of the polishing pad 110. For example, the polishing slurry 150 may be supplied onto the polishing surface through a supply nozzle 140.

The flow rate of the polishing slurry 150 that is sprayed through the supply nozzle 140 may be about 10 ml/min to about 1,000 ml/min, for example, about 10 ml/min to about 800 ml/min, for example, from about 50 ml/min to about 500 ml/min, but is not limited thereto.

The polishing slurry 150 may include silica particles or ceria particles, but is not limited thereto.

The semiconductor substrate 130 may come into contact with the polishing surface by pressing with a predetermined load in a state in which it is supported by a polishing head 160. For example, the load under which the polishing target surface of the semiconductor substrate 130 is pressed onto the polishing surface by the polishing head 160 may be selected within the range of, for example, about 0.01 psi to about 20 psi according to the purpose, and may be, for example, about 0.1 psi to about 15 psi, but is not limited thereto. When the polishing surface of the polishing layer and the polishing target surface of the semiconductor substrate are brought into contact with each other by the above-described load, the polishing layer may exhibit hardness and elongation represented by the above-described peak characteristics, and the elasticity and contact area corresponding thereto may be provided to the polishing target surface of the semiconductor substrate, and accordingly, the removal rate of the semiconductor substrate and the defect prevention effect may be effectively achieved at desired levels.

The semiconductor substrate 130 and the polishing pad 110 may be rotated relative to each other in a state in which the polishing target surface and the polishing surface are in contact with each other. In this case, the rotating direction of the semiconductor substrate 130 and the rotating direction of the polishing pad 110 may be the same direction or may be opposite to each other. The rotating speed of each of the semiconductor substrate 130 and the polishing pad 110 may be selected within the range of about 10 rpm to about 500 rpm depending on the purpose, and may be, for example, about 30 rpm to about 200 rpm, but is not limited thereto. When the rotating speed of each of the semiconductor substrate and the polishing pad satisfies the above range, the polishing layer may exhibit hardness and elongation represented by the above-described peak characteristics, and the elasticity and contact area corresponding thereto may be provided to the polishing target surface of the semiconductor substrate, and accordingly, the removal rate of the semiconductor substrate and the defect prevention effect may be effectively achieved at desired levels.

In one embodiment, the method for fabricating a semiconductor device may further include a step of processing the polishing surface of the polishing pad 110 by a conditioner 170 at the same time as polishing of the semiconductor substrate 130 in order to maintain the polishing surface of the polishing pad 110 in a state suitable for polishing.

In one embodiment, in the method for fabricating a semiconductor device, the semiconductor substrate may include a silicon dioxide ($SiO_2$) layer, the polishing target surface may be the surface of the silicon dioxide ($SiO_2$) layer, the number of surface defects on the polishing target surface after completion of the polishing may be less than 5, and the average removal rate of the silicon dioxide ($SiO_2$) layer may be 2,500 Å/min to 4,000 Å/min.

The method for fabricating a semiconductor device may realize the above-described removal rate and defect prevention performance on a semiconductor substrate having a silicon dioxide ($SiO_2$) layer as a polishing target by applying the polishing pad including the polishing layer having the above-described characteristics.

Hereinafter, specific embodiments of the present disclosure will be presented. However, the examples described below serve merely to illustrate or explain the present disclosure in detail, and the scope of the present disclosure should not be limited thereto.

Example 1

2,4-TDI, 2,6-TDI and $H_{12}$MDI as diisocyanate components were mixed together at the weight ratio described in Table 1 below, based on 100 parts by weight of the total weight of the diisocyanate components. PTMG and DEG as polyol components were mixed together at the weight ratio described in Table 1 below, based on 100 parts by weight of the total weight of the polyol components. A raw material mixture was prepared by mixing 150 parts by weight of the mixture of the polyol components with 100 parts by weight of the mixture of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 9 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.96. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 90° C., at a discharge rate of 10 kg/min, and at the same time, nitrogen gas ($N_2$) as a gaseous foaming agent was injected at an injection rate of 1.0 L/min for the same time as the injection time of the preliminary composition. Then, a polishing layer was produced by subjecting the preliminary composition to a post-curing reaction at a temperature of 110° C.

Example 2

2,4-TDI, 2,6-TDI and $H_{12}$MDI as diisocyanate components were mixed together at the weight ratio described in Table 1 below, based on 100 parts by weight of the total weight of the diisocyanate components. PTMG and DEG as polyol components were mixed together at the weight ratio described in Table 1 below, based on 100 parts by weight of the total weight of the polyol components. A raw material mixture was prepared by mixing 150 parts by weight of the mixture of the polyol components with 100 parts by weight of the mixture of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 9.2 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.94. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 95° C., at a discharge rate of 10 kg/min. Then, a polishing layer was produced by subjecting the preliminary composition to a post-curing reaction at a temperature of 110° C.

Example 3

2,4-TDI, 2,6-TDI and $H_{12}MDI$ as diisocyanate components were mixed together at the weight ratio described in Table 1 below, based on 100 parts by weight of the total weight of the diisocyanate components. PTMG and DEG as polyol components were mixed together at the weight ratio described in Table 1 below, based on 100 parts by weight of the total weight of the polyol components. A raw material mixture was prepared by mixing 150 parts by weight of the mixture of the polyol components with 100 parts by weight of the mixture of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 9.2 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.92. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 100° C., at a discharge rate of 10 kg/min. Then, a polishing layer was produced by subjecting the preliminary composition to a post-curing reaction at a temperature of 110° C.

Comparative Example 1

2,4-TDI and 2,6-TDI as diisocyanate components were mixed together at the weight ratio described in Table 1 below, based on 100 parts by weight of the total weight of the diisocyanate components. PTMG and DEG as polyol components were mixed together at the weight ratio described in Table 1 below, based on 100 parts by weight of the total weight of the polyol components. A raw material mixture was prepared by mixing 220 parts by weight of the mixture of the polyol components with 100 parts by weight of the mixture of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 6 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.75. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 90° C., at a discharge rate of 10 kg/min. Then, a polishing layer was produced by subjecting the preliminary composition to a post-curing reaction at a temperature of 110° C.

Comparative Example 2

2,4-TDI, 2,6-TDI and $H_{12}MDI$ as diisocyanate components were mixed together at the weight ratio described in Table 1 below, based on 100 parts by weight of the total weight of the diisocyanate components. PTMG and DEG as polyol components were mixed together at the weight ratio described in Table 1 below, based on 100 parts by weight of the total weight of the polyol components. A raw material mixture was prepared by mixing 220 parts by weight of the mixture of the polyol components with 100 parts by weight of the total amount of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 8.0 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.70. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 100° C., at a discharge rate of 10 kg/min. Then, a polishing layer was produced by subjecting the preliminary composition to a post-curing reaction at a temperature of 110° C.

Each of the polishing layers of Examples 1 to 3 and Comparative Examples 1 and 2 was processed to a thickness of 2 mm, and subjected to a process of machining grooves having a concentric shape on the polishing surface thereof. Next, a 1.1-mm-thick cushion layer including a urethane-based resin impregnated into a polyester resin nonwoven fabric was prepared, and a heat-sealing adhesive was applied to a surface opposite to the polishing surface and to the attachment surface of the cushion layer, and the adhesive-applied surfaces were laminated to each other using a pressure roller. As a result, final polishing pads were produced.

Experimental Example 1: Nuclear Magnetic Resonance (NMR) $^{13}C$ Spectra of Preliminary Compositions For each of the preliminary compositions of Examples 1 to 3 and Comparative Examples 1 and 2, 5 mg of the preliminary composition was dissolved in $CDCl_3$ and $^{13}C$-NMR analysis thereof was performed using a nuclear magnetic resonance (NMR) apparatus (JEOL 500 MHz) at room temperature.

Pulse NMR measurements were made under the following conditions: a pulse width of 90° pulse, 2.0 μs, a repetition time of 2 seconds, a number of scans of 5,100, and a measurement temperature of room temperature (RT) (25° C.).

Experimental Example 2: Nuclear Magnetic Resonance (NMR) $^{13}C$ Spectra of Processed Compositions For each of the polishing layers of Examples 1 to 3 and Comparative Examples 1 and 2, 1 g of the polishing layer was added to 15 ml of a 0.3 M aqueous solution of sodium hydroxide (KOH) and allowed to react in a closed container having a volume of 48 ml at a temperature 150° C. for 48 hours, thus preparing a processed composition. 5 mg of the processed composition was dissolved in $CDCl_3$, and $^{13}C$-NMR analysis thereof was performed using a nuclear magnetic resonance (NMR) apparatus (JEOL 500 MHz, 90° pulse) at room temperature.

Pulse NMR measurements were made under the following conditions: a pulse width of 90° pulse, 2.0 μs, a repetition time of 2 seconds, a number of scans of 5,100, and a measurement temperature of room temperature (RT) (25° C.).

Experimental Example 3: Evaluation of Physical Properties of Polishing Layer or Polishing Pad (1) Hardness Each of the polishing layers of Examples 1 to 3 and Comparative Examples 1 and 2 was processed to a thickness of 2 mm, and then cut to a size of 5 cm (width)×5 cm (length), thus preparing samples. After each of the samples was stored at a temperature of 25° C. for 12 hours, and then the Shore D hardness thereof was measured using a durometer.

(2) Tensile Strength

Each of the polishing layers of Examples 1 to 3 and Comparative Examples 1 and 2 was processed to a thickness of 2 mm, and then cut to a size of 4 cm (width)×1 cm (length), thus preparing samples. For each of the samples, the maximum strength value immediately before breaking was measured using a universal testing machine (UTM) at a speed of 50 mm/min.

(3) Elongation

Each of the polishing layers of Examples 1 to 3 and Comparative Examples 1 and 2 was processed to a thickness of 2 mm, and then cut to a size of 4 cm (width)×1 cm (length), thus preparing samples. For each of the samples, the maximum deformed length immediately before breaking was measured using a universal testing machine (UTM) at a speed of 50 mm/min, and then the ratio of the maximum deformed length to the initial length was expressed as a percentage (%).

(4) Cut Rate

For each polishing pad produced as described above using each of the polishing layers of Examples 1 to 3 and Comparative Examples 1 and 2, the polishing pad was preconditioned with deionized water for 10 minutes, and then conditioned while spraying deionized water thereto for 1 hour. The thickness that changed in the conditioning process was measured, and then the thickness change (μm/hr) was calculated as the cut rate of the polishing pad. The system used for conditioning was AP-300HM (CTS Co., Ltd.), the conditioning pressure was 6 lbf, the rotating speed was 100 to 110 rpm, and the disk used for conditioning was CI-45 (Sasol Co., Ltd.).

(5) Average Pore Size

The average diameter size of the pores of each polishing layer was measured using a particle size analyzer. The average pore size refers to D50.

(6) Specific Gravity

The specific gravity of the window prepared according to each of the Examples and the Comparative Examples was measured. Each polishing pad was cut to a size of 2 cm×2 cm (thickness: 2 mm) and then allowed to stand in an environment having a temperature of 25° C. and a humidity of 50±5% environment for 16 hours. Thereafter, the initial weight of each pad and the weight of each pad after immersed in water were measured using an electronic densimeter, and then the density of each pad was calculated.

Experimental Example 4: Evaluation of Polishing Performance

After polishing pads to which the polishing layers of Examples 1 to 3 and Comparative Examples 1 and 2 were applied, respectively, were produced, the polishing performance thereof was evaluated as follows.

Silicon dioxide ($SiO_2$) was deposited on a silicon wafer having a diameter of 300 mm by a chemical vapor deposition (CVD) process. Each of the polishing pads was attached to a CMP machine, and the silicon wafer was mounted such that the surface of the silicon dioxide layer on the silicon wafer faced the polishing surface of the polishing pad. While a calcined ceria slum was supplied onto the polishing pad at a rate of 250 mL/min, the silicon wafer was pressed against the polishing surface by a load of 4.0 psi. The rotating speed of each of the polishing pad and the silicon wafer was set to 150 rpm, and the silicon dioxide layer was polished for 60 seconds. After polishing, the silicon wafer was detached from the carrier, mounted on a spin dryer, washed with distilled water, and then dried with nitrogen for 15 seconds.

(1) Average Removal Rate

For the dried silicon wafer, the layer thickness change between before and after polishing was measured using an optical interference type thickness measuring instrument (SI-F80R, Keyence). Then, the removal rate was calculated using the equation shown below. In this way, the removal rate was measured a total of 5 times, and the number average value thereof was calculated as the average removal rate.

Removal rate (Å/min)=polished thickness (Å) of silicon water/polishing time (min)

(2) Defects

Polishing was performed in the same manner as the removal rate measurement method, and the number of defects such as scratches was determined by visually observing the polished surface of the polishing target. Specifically, after polishing, the silicon wafer was moved to a cleaner and rinsed with each of a mixture of 1% hydrogen fluoride (HF) and purified water (DIW) and a mixture of 1% nitric acid ($H_2NO_3$) and purified water (DIW) for 10 seconds per rinse. Then, the silicon wafer was transferred into a spin dryer, washed with purified water (DIW), and then dried with nitrogen for 15 seconds. For the dried silicon wafer, the change in defects between before and after polishing was visually observed using a defect measuring instrument (Tenkor, XP+).

The results of Experimental Examples 1 to 4 above are shown in Table 1 below.

TABLE 1

| | | | Example 1 | Example 2 | Example 3 | Comp. Example 1 | Comp. Example 2 |
|---|---|---|---|---|---|---|---|
| Composition of preliminary composition | Diisocyanate | 2,4-TDI | 73 | 72 | 70 | 96 | 80 |
| | | 2,6-TDI | 17 | 16 | 15 | 4 | 5 |
| | | $H_{12}$MDI | 10 | 12 | 15 | — | 15 |
| | | Total | 100 | 100 | 100 | 100 | 100 |
| | Polyol | PTMG (Mw 1000) | 90.8 | 89.9 | 89.9 | 90.0 | 97.5 |
| | | DEG (Mw 106) | 9.2 | 10.1 | 10.1 | 10.0 | 2.5 |
| | | Total | 100 | 100 | 100 | 100 | 100 |
| | NCO group content (wt %) of preliminary composition | | 9 | 9.2 | 9.5 | 6 | 8 |
| Amine curing agent | Molar ratio of $NH_2$ of curing agent to NCO of preliminary composition | | 0.96 | 0.94 | 0.92 | 0.75 | 0.70 |
| Process conditions | Reaction temperature (° C.) for prepolymer production | | 80 | 80 | 80 | 80 | 80 |
| | Preheating temperature (° C.) of curing mold | | 90 | 95 | 100 | 90 | 100 |
| | Post-curing temperature (° C.) | | 110 | 110 | 110 | 110 | 110 |
| $^{13}$C NMR of preliminary composition | Peak position (ppm) | Fifth peak (17.5 to 20) | 17.694 | 17.681 | 17.673 | 17.627 | 17.713 |
| | | Sixth peak (16 to 17.5) | 17.026 | 16.897 | 17.016 | 17.226 | 17.293 |
| | Area ratio | Fifth peak: sixth peak | 3.18:1 | 1.66:1 | 1.72:1 | 3.89:1 | 6.02:1 |
| $^{13}$C NMR of processed composition | Peak position (ppm) | First peak (15 to 18) | 16.549 | 16.196 | 16.559 | 16.263 | 17.093 |
| | | Second peak (9 to 11) | 10.292 | 9.930 | 10.302 | 10.006 | 10.843 |
| | | Third peak (138 to 143) | 141.082 | 140.853 | 141.177 | 140.824 | 143.104 |
| | | Fifth peak (55 to 65) | 62.533 | 62.123 | 62.581 | 62.352 | 61.112 |
| | Area ratio* | P3:P2 | 3.15:1 | 3.40:1 | 3.94:1 | 5.31:1 | 5.25:1 |
| | | P4/(P1 + P2) * 100 [area %] | 37.81 | 51.30 | 60.43 | 0.00 | 78.45 |
| | | (P1 + P2)/(P1 + P2 + P3) * 100 [area %] | 68.44 | 69.28 | 64.00 | 65.89 | 58.00 |
| | Softening control index | | 0.26 | 0.36 | 0.39 | 0.00 | 0.46 |
| Physical properties of polishing layer or polishing pad | Thickness (mm) | | 2 | 2 | 2 | 2 | 2 |
| | Hardness (Shore D) | | 58.4 | 56.8 | 57.4 | 43 | 45 |
| | Tensile strength (N/mm$^2$) | | 21.4 | 22.1 | 22.3 | 14.5 | 18.5 |
| | Elongation (%) | | 94.4 | 106.5 | 103.7 | 230.8 | 240.2 |
| | Polisbing pad cut rate (μm/hr) | | 51.2 | 50.3 | 43.3 | 84.5 | 90.2 |
| | Average pore size (μm) | | 24.1 | 20.7 | 22.2 | 21 | 11.2 |
| | Specific gravity (g/cc) | | 0.8 | 0.8 | 0.8 | 0.8 | 0.8 |
| Polishing performance | Average removal rate (Å/min) | | 3724 | 3323 | 3357 | 2357 | 2345 |
| | Number of defects (ea) | | 0.5 | 1 | 2 | 4 | 5 |

*P1: first peak area, P2: second peak area, P3: third peak area, P4: fourth peak area Referring to Table 1 above, it could be confirmed that, in the case of the polishing pads of Examples 1 to 3 in which the nuclear magnetic resonance (NMR) $^{13}$C spectrum of the processed composition prepared by reacting the polishing layer of each polishing pad under predetermined treatment conditions includes the first to fourth peaks and to which the polishing layer satisfying a softening control index of 0.10 to 0.45 as calculated by Equation 1 above was applied, the polishing pads could exhibit suitable levels of physical properties such as hardness, and furthermore, exhibited a suitable level of average removal rate and a low defect level as the resultant polishing performance in the polishing process.

Specifically, it could be confirmed that, since the polishing layers of the polishing pads of Examples 1 to 3 satisfied a softening control index of about 0.10 to about 0.40, more specifically, about 0.20 to about 0.40, as calculated by Equation 1 above, these polishing pads showed relatively high hardness and tensile strength and relatively low elongation, compared to the polishing pads of Comparative Examples 1 and 2 in which the softening control index was excessively low or excessively high.

By virtue of such physical property characteristics of the polishing layers of Examples 1 to 3, the cut rate of each polishing layer prepared as a polishing pad may be ensured at a level of about 40 μm/hr to about 55 μm/hr, which is lower than those of Comparative Examples 1 and 2. This cut rate has a technical significance in that the surface of the polishing pad is properly cut off by a suitable level of external force during the polishing process, and at the same time, appropriate rigidity with a predetermined ductility is transferred to the polishing target surface of the semiconductor substrate through the polishing surface, and thus a desired level of removal rate and defect prevention performance in final polishing may be achieved.

Experimental Example 5: Measurement of Molecular Weight of Processed Composition About 1 g of the polishing layers of each of the Examples and the Comparative Examples was added to 15 ml of an about 0.3 M aqueous solution of KOH. Thereafter, the KOH solution containing each polishing layer was placed in a closed pressure container having a volume of about 48 ml and subjected to depolymerization at a temperature of about 150° C. at a pressure of about 3 bar for about 48 hours. Then, each of the depolymerized compositions was extracted with methylene chloride.

The weight-average molecular weight (Mw), number-average molecular weight (Mn) and peak molecular weight (Mp) of each of the extracted compositions were measured by a gel permeation chromatography (GPC) system. As controls, the Mw, Mn and Mp values of the urethane-based prepolymer contained in the preliminary composition of Example 1 were measured.

The GPC system and the measurement conditions were as follows.

Measurement system: Agilent 1260 Infinity GPC
Flow rate: 1 ml/min in THF
Injection volume: 100 µl
Column temperature: 40° C.
Detector: RI
Column: TSKgel G1000HxL Molecular Weight Size 5060

Using the GPC measurement values, the value according to the following Equation 2 was calculated:

$$\frac{Mw - Mn}{Mp - Mn} \quad [\text{Equation 2}]$$

wherein

Mw is the weight-average molecular weight of the depolymerized composition,

Mn is the number-average molecular weight of the depolymerized composition, and

Mp is the peak molecular weight of the depolymerized composition.

The results of Experimental Example 5 above are shown in Table 2 below.

TABLE 2

|  | Control | Example 1 | Example 2 | Example 3 | Comp. Example 1 | Comp. Example 2 |
|---|---|---|---|---|---|---|
| Mn | 3040 | 2725 | 2732 | 2745 | 2320 | 2163 |
| Mp | 4032 | 3229 | 3158 | 3160 | 2418 | 2359 |
| Mw | 4281 | 3331 | 3347 | 3357 | 2559 | 2560 |
| Value calculated by Equation 2 | — | 1.20 | 1.44 | 1.47 | 2.44 | 2.03 |

Referring to the measurement results in Table 2 above, as a result of comparing the GPC measurement results of the Examples and the Comparative Examples with the GPC measurement results of the urethane-based prepolymer as the control, it can be confirmed that the positions of decomposition by depolymerization in the Examples and the Comparative Examples were different from those in the prepolymer. Specifically, this means that the urethane-based prepolymer is produced into a polishing layer by curing, and then the portions thereof decomposed by depolymerization are different from the portions of the prespolymer, which are bonded together upon polymerization. In addition, as a result of GPC measurement, it was confirmed that the polishing pads of Examples 1 to 3 after depolymerization had a weight-average molecular weight (Mw) of 2,600 or more and a number-average molecular weight of 2,500 or more, which were different from those of Comparative Examples 1 and 2.

In addition, the values calculated by Equation 2 for the polishing pads of the Examples are also within the range of 1 to 2, which is the range specified in the present disclosure. Specifically, the polishing layer includes a cured product obtained by curing the composition containing the urethane-based prepolymer, the curing agent and the foaming agent, and the urethane-based prepolymer may be produced by reacting a polyol with an isocyanate. The polyol compound used for production of the polishing layer may form an appropriate cross-linked structure in the urethane-based prepolymer. The polishing layer formed by curing the preliminary composition containing the urethane-based prepolymer under predetermined process conditions shows the GPC measurement values of the processed composition obtained by treatment under predetermined conditions, satisfies the value calculated by Equation 2 above, which corresponds to the GPC measurement values, and thus may exhibit excellent polishing properties. It was confirmed that the Comparative Examples showed lower values (calculated by Equation 2), and showed a relatively low removal rate and a relatively large number of defects as shown in Table 1 above, suggesting that they exhibit lower polishing performance than the Examples of the present disclosure.

Example 4

2,4-TDI, 2,6-TDI and $H_{12}$MDI as diisocyanate components were mixed together at the weight ratio described in Table 3 below, based on 100 parts by weight of the total weight of the diisocyanate components. PTMG and DEG as polyol components were mixed together at the weight ratio described in Table 3 below, based on 100 parts by weight of the total weight of the polyol components. A raw material mixture was prepared by mixing 150 parts by weight of the mixture of the polyol components with 100 parts by weight of the mixture of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 9.2 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.94. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 95° C., at a discharge rate of 10 kg/min. Then, a polishing layer was produced by subjecting the preliminary composition to a post-curing reaction at a temperature of 110° C.

Example 5

2,4-TDI, 2,6-TDI and $H_{12}$MDI as diisocyanate components were mixed together at the weight ratio described in Table 3 below, based on 100 parts by weight of the total weight of the diisocyanate components. PTMG and DEG as polyol components were mixed together at the weight ratio described in Table 3 below, based on 100 parts by weight of the total weight of the polyol components. A raw material mixture was prepared by mixing 150 parts by weight of the mixture of the polyol components with 100 parts by weight of the mixture of the diisocyanate components. A preliminary composition containing a urethane-based prepolymer was prepared by placing the raw material mixture in a four-neck flask and then allowing the mixture to react at 80° C. The content of isocyanate groups (NCO groups) in the preliminary composition was adjusted to 10.2 wt %. 4,4'-methylenebis(2-chloroaniline) (MOCA) as a curing agent was added to the preliminary composition so that the molar ratio of the $NH_2$ groups of the MOCA to the NCO groups in the preliminary composition was 0.90. In addition, 1.0 part by weight of a solid foaming agent (Akzonobel Corp.) as expandable particles was added to the preliminary composition. The preliminary composition was injected into a mold, having a width of 1,000 mm, a length of 1,000 mm and a height of 3 mm and preheated to 120° C. at a discharge rate of 10 kg/min. Then, a polishing layer was produced by subjecting the preliminary composition to a post-curing reaction at a temperature of 110° C.

Each of the polishing layers of Example 1, 3, 4 and 5 and Comparative Examples 1 and 2 was processed to a thickness of 2 mm, and subjected to a process of machining grooves having a concentric shape on the polishing surface thereof. Next, a 1.1-mm-thick cushion layer including a urethane-based resin impregnated into a polyester resin nonwoven fabric was prepared, and a heat-sealing adhesive was applied to a surface opposite to the polishing surface and to the attachment surface of the cushion layer, and the adhesive-applied surfaces were laminated to each other using a pressure roller. As a result, final polishing pads were produced.

The results of Experimental Examples 1 to 4 are shown in Table 3 below.

TABLE 3

| Item | | | Example 1 | Example 3 | Example 4 | Example 5 | Com. Example 1 | Comp. Example 2 |
|---|---|---|---|---|---|---|---|---|
| Composition of preliminary composition | Diisocyanate | 2,4-TDI | 73 | 70 | 71 | 68 | 96 | 80 |
| | | 2,6-TDI | 17 | 15 | 16 | 14 | 4 | 5 |
| | | $H_{12}$MDI | 10 | 15 | 13 | 18 | — | 15 |
| | | Total | 100 | 100 | 100 | 100 | 100 | 100 |
| | Polyol | PTMG (Mw 1000) | 90.8 | 89.9 | 89.9 | 89.9 | 90 | 97.5 |
| | | DEG (Mw 106) | 9.2 | 10.1 | 10.1 | 10.1 | 10 | 2.5 |
| | | Total | 100 | 100 | 100 | 100 | 100 | 100 |
| | NCO group content (wt %) of preliminary composition | | 9 | 9.5 | 9.2 | 10.2 | 6 | 8 |
| Amine curing agent | Molar ratio of $NH_2$ of curing agent to NCO of preliminary composition | | 0.96 | 0.92 | 0.94 | 0.9 | 0.75 | 0.7 |
| Process conditions | Reaction temperature (° C.) for prepolymer production | | 80 | 80 | 80 | 80 | 80 | 80 |
| | Preheating temperature (° C.) of curing mold (° C.) | | 90 | 100 | 95 | 120 | 90 | 100 |
| | Post-curing temperature (° C.) | | 110 | 110 | 110 | 110 | 110 | 110 |
| $^{13}$C NMR of preliminary composition | Peak position (ppm) | Fifth peak (17.5 to 20) | 17.694 | 17.673 | 17.682 | 17.691 | 17.627 | 17.713 |
| | | Sixth peak (16 to 17.5) | 17.026 | 17.016 | 16.997 | 16.998 | 17.226 | 17.293 |
| | Area ratio | Fifth peak: Sixth peak | 3.18:1 | 1.72:1 | 1.67:1 | 2.01:1 | 3.89:1 | 6.02:1 |
| $^{13}$C NMR of processed composition | Peak position (ppm) | First peak (15 to 18) | 16.549 | 16.559 | 16.196 | 16.559 | 16.263 | 17.093 |
| | | Second peak (9 to 11) | 10.292 | 10.302 | 9.93 | 10.302 | 10.006 | 10.843 |
| | | Third peak (138 to 143) | 141.082 | 141.177 | 140.853 | 141.167 | 140.824 | 143.104 |
| | Area ratio | Third peak: Seconds peak | 3.15:1 | 3.94:1 | 3.34:1 | 4.16:1 | 5.31:1 | 5.25:1 |
| | | First peak: Second peak | 10:01.7 | 10:01.7 | 10:01.7 | 10:01.7 | 10:01.1 | 10:01.6 |
| | | First peak: Third peak | 10:05.4 | 10:06.6 | 10:05.5 | 10:06.9 | 10:05.7 | 10:08.4 |
| Physical properties of polishing layer or polishing | Hardness (Shore D) | | 58.4 | 57.4 | 56.2 | 58 | 43 | 45 |
| | Tensile strength (N/mm$^2$) | | 21.4 | 22.3 | 22.2 | 21.5 | 14.5 | 18.5 |

TABLE 3-continued

| | Item | Example 1 | Example 3 | Example 4 | Example 5 | Com. Example 1 | Comp. Example 2 |
|---|---|---|---|---|---|---|---|
| pad | Elongation (%) | 94.4 | 103.7 | 107.5 | 100.5 | 230.8 | 240.2 |
| | Polishing pad cut rate (μm/hr) | 51.2 | 43.3 | 51.3 | 42.2 | 84.5 | 90.2 |
| Polishing performance | Average removal rate (Å/min) | 3724 | 3357 | 3324 | 3253 | 2357 | 2345 |
| | Number of defects (ea) | 0.5 | 2 | 1 | 1.5 | 4 | 5 |

Referring to Table 3 above, it can be confirmed that the polishing layer of each of the Examples was a polishing layer wherein the nuclear magnetic resonance (NMR) $^{13}$C spectrum of a processed composition prepared by treatment under predetermined conditions included a first peak appearing at 15 ppm to 18 ppm, a second peak appearing at 9 ppm to 11 ppm, and a third peak appearing at 138 ppm to 143 ppm, and the area ratio of the third peak to the second peak was 1:1 to 5:1. Based on the properties corresponding thereto, such as hardness, tensile strength, elongation and cut rate, it can be confirmed that results of polishing the semiconductor substrate using the polishing layer were excellent.

In contrast, it can be confirmed that the polishing layers of the Comparative Examples showed physical properties, including low hardness and tensile strength and high elongation and cut rate compared to the polishing layers of the Examples, because the area ratio of the third peak to the second peak was out of the range of 1:1 to 5:1. Accordingly, it can be confirmed that the polishing pads of Comparative Examples 3 and 4 did not exhibit polishing performance on the polishing target surface at the levels shown by the polishing pads of the Examples, and thus were inferior in terms of average removal rate and defects.

As described above, the polishing pad according to the present disclosure includes the polishing layer having a chemical bond structure and a crosslinked structure, which correspond to the peak characteristics shown by a processed composition prepared by treating the polishing pad under predetermined conditions. Accordingly, the polishing surface of the polishing layer may exhibit appropriate hardness, and thus exhibit a removal rate and surface characteristics within desired ranges in polishing of a polishing target. In addition, the polishing layer has an advantage in that the polishing surface thereof maintains a surface state equivalent to the initial state even with the passage of time during the polishing process, and thus the long-term polishing performance thereof does not deteriorate.

The method of fabricating a semiconductor device using the polishing pad exhibits high process efficiency in polishing of a semiconductor substrate as a polishing target, and may be effective in that the polishing target surface of the semiconductor substrate shows an appropriate removal rate and the lowest level of defects in the final polishing results.

Although preferred embodiments of the present disclosure have been described in detail above, the scope of the present disclosure is not limited thereto, and various modifications and improvements made by those skilled in the art without departing from the basic concept of the present disclosure as defined by the appended claims also fall within the scope of the present disclosure.

What is claimed is:

1. A polishing pad comprising a polishing layer, wherein a nuclear magnetic resonance (NMR) $^{13}$C spectrum of a processed composition prepared by adding 1 g of the polishing layer to a 0.3 M aqueous solution of potassium hydroxide (KOH) and allowing the mixture to react in a closed container at a temperature of 150° C. for 48 hours includes a first peak appearing at 15 ppm to 18 ppm, a second peak appearing at 9 ppm to 11 ppm, a third peak appearing at 138 ppm to 143 ppm, and a fourth peak appearing at 55 ppm to 65 ppm, and a softening control index calculated by Equation 1 below is 0.10 to 0.45, wherein, the polishing layer comprises a cured product of a preliminary composition containing a urethane-based prepolymer, wherein, the preliminary composition contains a reaction product of an isocyanate compound and a polyol compound, and the isocyanate compound includes an aromatic diisocyanate and an alicyclic diisocyanate compound, and the alicyclic diisocyanate compound is 5 parts by weight to 30 parts by weight based on 100 parts by weight of the aromatic diisocyanate, $$\text{Softening control index} = \frac{I4}{100 + I2 + I3} \quad \text{[Equation 1]}$$

wherein I2 is a ratio of the area of the second peak to the area of the first peak which is taken as 100.00, I3 is a ratio of the area of the third peak to the area of the first peak which is taken as 100.00, and I4 is a ratio of the area of the fourth peak to the area of the first peak which is taken as 100.00.

2. The polishing pad of claim 1, wherein
a percentage of the area of the fourth peak relative to a total area of the first peak and the second peak is 30% to 75%, and
a percentage of the total area of the first peak and the second peak relative to a total area of the first peak, the second peak and the third peak is 60% to 70%.

3. The polishing pad of claim 1, wherein
an area ratio of the third peak to the second peak is 1:1 to 5:1.

4. The polishing pad of claim 1, wherein
an area ratio of the first peak to the second peak is 10:1 to 10:5.

5. The polishing pad of claim 1, wherein
the polishing layer has a value of 1 to 2 as calculated according to Equation 2 below:

$$\frac{Mw - Mn}{Mp - Mn} \quad \text{[Equation 2]}$$

wherein Mw, Mn and Mp are molecular weights measured by gel permeation chromatography (GPC) for a depolymerized composition prepared by adding 1 g of the polishing layer to 15 ml of a 0.3 M aqueous solution of KOH and depolymerizing the polishing layer in a closed container at 150° C. for 48 hours, Mw is the weight-average molecular weight of the depolymerized composition, Mn is the number-average molecular weight of the depolymerized composition, and Mp is the peak molecular weight of the depolymerized composition.

6. The polishing pad of claim 5, wherein the weight-average molecular weight (Mw) is 2,600 to 4,000, and the number-average molecular weight (Mn) is 2,500 to 3,000.

7. The polishing pad of claim 1, wherein, a nuclear magnetic resonance (NMR) $^{13}C$ spectrum of the preliminary composition shows a fifth peak and a sixth peak in descending order of peak position (ppm) at 16 ppm to 20 ppm, and an area ratio of the fifth peak to the sixth peak is 1:1 to 5:1.

8. The polishing pad of claim 7, wherein, an isocyanate group content of the preliminary composition is 5 wt % to 11 wt %, and the polyol compound comprises a low-molecular-weight polyol having a weight-average molecular weight (Mw) of about 100 g/mol to less than about 300 g/mol and a high-molecular-weight polyol having a weight-average molecular weight (Mw) of about 300 g/mol to about 1,800 g/mol.

9. The polishing pad of claim 7, wherein the aromatic isocyanate compound comprises 2,4-toluene diisocyanate (2,4-TDI) and 2,6-toluene diisocyanate (2,6-TDI), and the preliminary composition contains a urethane-based prepolymer comprising at least one of a first unit structure derived from 2,4-TDI subjected to urethane reaction at one end, and a second unit structure derived from 2,6-TDI subjected to urethane reaction at one end, and a third unit structure derived from 2,4-TDI subjected to urethane reaction at both ends, and further contains 2,6-TDI remaining unreacted at both ends.

10. The polishing pad of claim 1, wherein the polishing layer has a tensile strength of 20 to 25 $N/mm^2$ and an elongation of 90 to 130%.

* * * * *